(12) United States Patent
Park et al.

(10) Patent No.: US 10,438,802 B2
(45) Date of Patent: Oct. 8, 2019

(54) METHOD OF FABRICATING A SEMICONDUCTOR DEVICE

(71) Applicant: SAMSUNG ELECTRONICS CO., LTD., Suwon-si, Gyeonggi-do (KR)

(72) Inventors: Hyun Park, Suwon-si (KR); Naein Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/679,315

(22) Filed: Aug. 17, 2017

(65) Prior Publication Data
US 2018/0130665 A1  May 10, 2018

(30) Foreign Application Priority Data
Nov. 7, 2016 (KR) .................. 10-2016-0147680

(51) Int. Cl.
| | |
|---|---|
| *H01L 21/285* | (2006.01) |
| *H01L 21/28* | (2006.01) |
| *H01L 21/311* | (2006.01) |
| *H01L 21/32* | (2006.01) |
| *H01L 21/3205* | (2006.01) |
| *H01L 27/108* | (2006.01) |
| *H01L 29/51* | (2006.01) |
| *H01L 27/11582* | (2017.01) |

(52) U.S. Cl.
CPC .. *H01L 21/28562* (2013.01); *H01L 21/28061* (2013.01); *H01L 21/28282* (2013.01); *H01L 21/31144* (2013.01); *H01L 21/32* (2013.01); *H01L 21/32051* (2013.01); *H01L 27/10855* (2013.01); *H01L 29/51* (2013.01); *H01L 27/10814* (2013.01); *H01L 27/10852* (2013.01); *H01L 27/11582* (2013.01)

(58) Field of Classification Search
CPC ......... H01L 21/28562; H01L 21/28061; H01L 21/28282
See application file for complete search history.

(56) References Cited

U.S. PATENT DOCUMENTS

| | | | |
|---|---|---|---|
| 7,399,709 | B1 | 7/2008 | Lin et al. |
| 8,080,451 | B2 | 12/2011 | Adam et al. |
| 9,123,706 | B2 | 9/2015 | Zierath et al. |
| 9,184,060 | B1 | 11/2015 | Lee |
| 9,209,039 | B2 | 12/2015 | Jain et al. |
| 9,269,586 | B2 | 2/2016 | Morgan et al. |

(Continued)

FOREIGN PATENT DOCUMENTS

KR  10-2005-0117879 A  12/2005

OTHER PUBLICATIONS

Carlsson, Selective deposition of tungsten JVST A, 1985.
(Continued)

*Primary Examiner* — Errol V Fernandes
(74) *Attorney, Agent, or Firm* — Lee & Morse, P.C.

(57) ABSTRACT

A method of fabricating a semiconductor device, the method including forming a deposition active layer and a guide pattern on a semiconductor substrate such that the guide pattern delimits an exposed surface of the deposition active layer; and selectively depositing a metal-containing layer on the exposed surface of the deposition active layer exposed by the guide pattern, wherein the deposition active layer is a nonmetal layer.

18 Claims, 29 Drawing Sheets

(56) References Cited

U.S. PATENT DOCUMENTS

| | | | |
|---|---|---|---|
| 2003/0045024 A1* | 3/2003 | Shimoto | H01L 21/4857 438/106 |
| 2004/0102048 A1 | 5/2004 | Yamaguchi | |
| 2004/0265745 A1 | 12/2004 | Sho et al. | |
| 2007/0190728 A1* | 8/2007 | Sreekantham | H01L 29/4925 438/270 |
| 2010/0117188 A1* | 5/2010 | Waldrab | H01L 21/0272 257/506 |
| 2013/0109148 A1 | 5/2013 | Oh et al. | |
| 2013/0161786 A1* | 6/2013 | Huang | H01L 27/10817 257/532 |

OTHER PUBLICATIONS

Kuijlaars, Modeling of selective WLPCVD_Thin Sold Films, 1996.
Yeh, Deposition properties of selective WCVD_Materials Chemistry and Physics, 1996.
Park, Selective ALD of TiO2_Langmuir 2004.
Yang, Selective deposition of Co, J Korean Physical Society, 2005.
Kang, Selective deposition of HfO using MOCVD_IEEE trans on nano technology, 2006.
Hughes, Nucleation delay in ALD on a thin orgranic layer and the role of reaction thermochemistry, JVST A, 2011.
Zhang, Effect of substrate composition on ALD using SAM, Engstrom group, JVST A, 2015.
Kessels, Area-Selective Deposition Workshop 2016 at IMEC.
Parsons, Area-Selective Deposition Workshop 2016 at IMEC.
Ritala, Area-Selective Deposition Workshop 2016 at IMEC.

\* cited by examiner

METHOD OF FABRICATING A SEMICONDUCTOR DEVICE

CROSS-REFERENCE TO RELATED APPLICATION

Korean Patent Application No. 10-2016-0147680, filed on Nov. 7, 2016, in the Korean Intellectual Property Office, and entitled: "Method of Fabricating a Semiconductor Device," is incorporated by reference herein in its entirety.

BACKGROUND

1. Field

Embodiments relate to a method of fabricating a semiconductor device.

2. Description of the Related Art

Due to their small-size, multifunctional, and/or low-cost characteristics, semiconductor devices are being esteemed as important elements in the electronic industry.

SUMMARY

The embodiments may be realized by providing a method of fabricating a semiconductor device, the method including forming a deposition active layer and a guide pattern on a semiconductor substrate such that the guide pattern delimits an exposed surface of the deposition active layer; and selectively depositing a metal-containing layer on the exposed surface of the deposition active layer exposed by the guide pattern, wherein the deposition active layer is a nonmetal layer.

The embodiments may be realized by providing a method of fabricating a semiconductor device, the method including forming a mold layer on a semiconductor substrate; forming a deposition active layer on the mold layer; forming a guide pattern on the deposition active layer to define an exposed surface of the deposition active layer; forming a metal mask pattern on the exposed surface of the deposition active layer using an area-selective deposition method; removing the guide pattern; and sequentially etching the deposition active layer and the mold layer by using the metal mask pattern as an etch mask.

The embodiments may be realized by providing a method of fabricating a semiconductor device, the method including forming an etching target layer on a semiconductor substrate; forming a deposition active layer on the etching target layer; forming a guide pattern on the deposition active layer such that the guide pattern exposes a surface of the deposition active layer; selectively depositing a metal-containing layer on the surface of the deposition active layer exposed by the guide pattern to form a metal-containing etching mask; and etching the etching target layer using the metal-containing etching mask.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully with reference to the accompanying drawings, in which example embodiments are shown.

Figure 1:
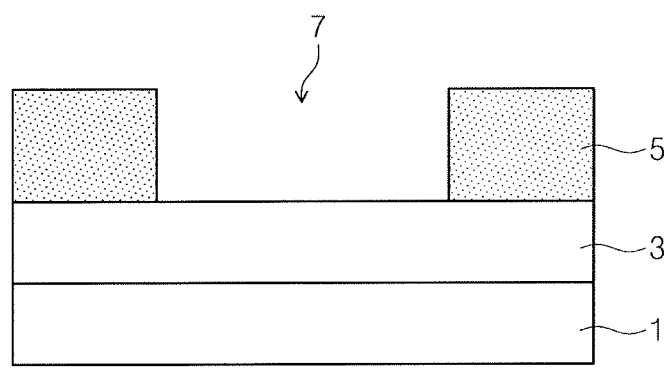
FIGS. 1 and 2 illustrate sectional views of stages in a process of fabricating a semiconductor device, according to some embodiments.
Figure 2:
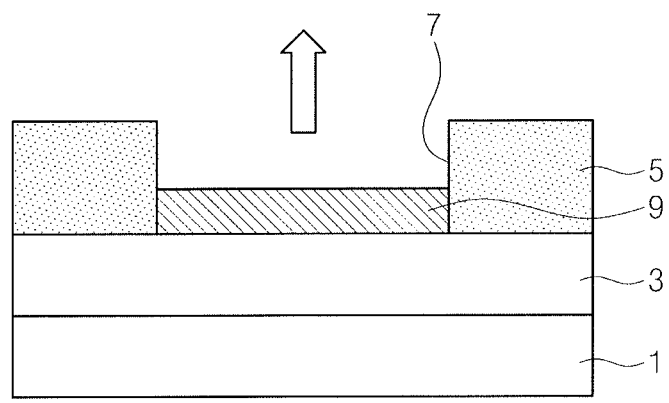

FIGS. 1 and 2 illustrate sectional views of stages in a process of fabricating a semiconductor device, according to some embodiments.

Referring to FIG. 1, a deposition active layer 3 may be formed on a semiconductor substrate 1. In an implementation, the deposition active layer 3 may be a nonmetal layer that does not contain any metal. For example, the deposition active layer 3 may be formed of a single-crystalline silicon layer that is doped with impurities or is undoped or a poly-crystalline silicon layer that is doped with impurities or is undoped. In an implementation, the deposition active layer 3 may be formed of titanium nitride layer. A guide pattern 5 may be formed on the deposition active layer 3. The guide pattern 5 may be formed of or may include, e.g., silicon oxide, silicon nitride, tetraethoxysilane (TEOS), or plasma-enhanced tetraethoxysilane (PE-TEOS). In an implementation, the guide pattern 5 may be formed of or may include, e.g., a hydrocarbon-based insulating material (such as a spin-on-hardmask (SOH) or a spin-on-carbon (SOC) material). The guide pattern 5 may include an opening 7 exposing the deposition active layer 3. For example, the guide pattern 5 may be provided to define an exposed surface of the deposition active layer 3.

Referring to FIG. 2, a metal-containing layer 9 may be selectively deposited on the exposed surface of the deposition active layer 3 (e.g., the surface of the deposition active layer 3 that is exposed by the opening 7 of the guide pattern 5). The metal-containing layer 9 may be formed of, e.g., tungsten (W), tungsten nitride (WN), tungsten carbide (WC), titanium (Ti), tantalum (Ta), aluminum (Al), or hafnium (Hf). The metal-containing layer 9 may be formed by an area-selective deposition method. For example, the metal-containing layer 9 may be deposited by repeating a process cycle a predetermined number of times. Each process cycle may include, e.g., supplying a first source gas (which may have a high adsorption rate on the deposition active layer 3 and a low adsorption rate on the guide pattern 5) onto the structure with the guide pattern 5 thereon, purging the first source gas that has not been adsorbed on the deposition active layer 3 (e.g., unreacted first source gas), supplying a second source gas (which may include a metallic element constituting the metal-containing layer 9 and that may react with molecules of the first source gas adsorbed on the deposition active layer 3) to form a metal-containing layer, e.g., a single atomic thickness metal-containing layer, on the deposition active layer 3, and purging the second source gas that has not reacted with the molecules of the first source gas. In the case where the metal-containing layer 9 is formed of tungsten, the first source gas may be or may include, e.g., hydrogen ($H_2$), monosilane ($SiH_4$), or diborane ($B_2H_6$), and the second source gas may be or may include, e.g., a tungsten halide (such as tungsten hexafluoride ($WF_6$), tungsten hexachloride ($WCl_6$)) or a tungsten-containing metal organic gas.

In an implementation, the first source gas and the second source gas may be supplied in an order different from that described above (e.g., in a reverse order). In an implementation, the first source gas and the second source gas may be supplied at the same time.

The metal-containing layer 9 may be selectively deposited on only a surface of the deposition active layer 3 and thus may extend upwardly from the surface of the deposition active layer 3 to fill the opening 7. For example, a pattern composed of the metal-containing layer 9 may be formed in the opening 7. The metal-containing layer 9 may be used as a hard mask in a semiconductor fabrication process or a metal line of a semiconductor device. Accordingly, it is possible to omit a metal etching step in a process of forming a metal pattern. As a result, it is possible to overcome an etching failure which may be caused by the crystal grains of the metal-containing layer 9, and it is possible to form a pattern in a desired shape.

The description that follows will refer to some examples in which the above method is used to fabricate a semiconductor device.

Figure 3:
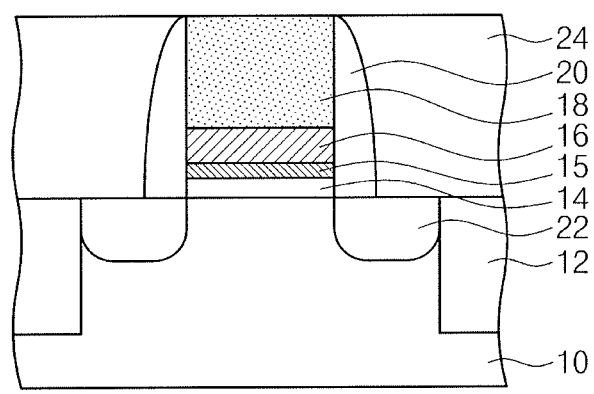
FIGS. 3 to 5 illustrate sectional views of stages in a process of fabricating a semiconductor device, according to some embodiments.
Figure 4:
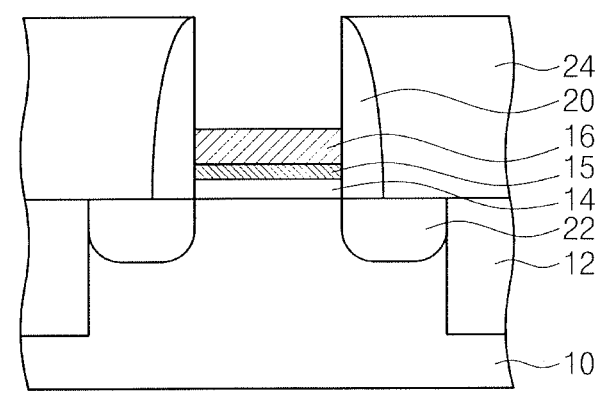
Figure 5:
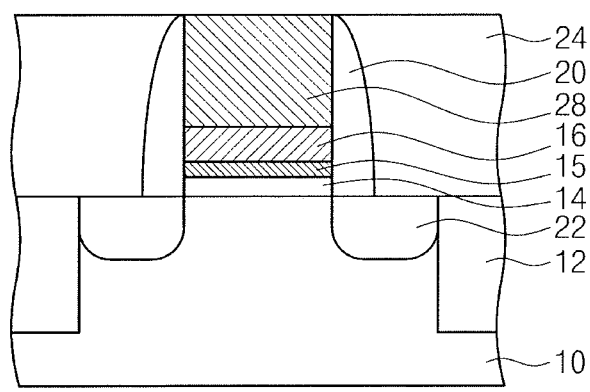

FIGS. 3 to 5 illustrate sectional views of stages in a process of fabricating a semiconductor device, according to some embodiments.

Referring to FIG. 3, a device isolation layer 12 may be formed on a semiconductor substrate 10 to define an active region. The device isolation layer 12 may be formed by, e.g., a shallow trench isolation (STI) method. A gate insulating layer 14, a work-function control layer 15, a poly-silicon layer 16, and a sacrificial layer 18 may be sequentially formed on the semiconductor substrate 10 and then may be patterned to expose the semiconductor substrate 10. The work-function control layer 15 may be formed of, e.g., titanium nitride. The poly-silicon layer 16 may have a role similar to that of the deposition active layer 3 of FIGS. 1 and 2. The poly-silicon layer 16 may be doped with impurities or undoped. The sacrificial layer 18 may be formed of a material (e.g., silicon nitride) having an etch selectivity with respect to the poly-silicon layer 16. After the patterning process, a spacer 20 may be formed to cover sidewalls of the sacrificial layer 18, the poly-silicon layer 16, the work-function control layer 15, and the gate insulating layer 14. The spacer 20 may have a role similar to that of the guide pattern 5 of FIGS. 1 and 2. For example, the spacer 20 may be formed of or may include silicon oxide. An interlayered insulating layer 24 may be formed to cover the spacer 20 and the semiconductor substrate 10.

Referring to FIG. 4, the sacrificial layer 18 may be selectively removed to expose a top surface of the poly-silicon layer 16 and a side surface of the spacer 20. In the case where the sacrificial layer 18 is formed of a silicon nitride layer, the sacrificial layer 18 may be removed by, e.g., an etching solution containing phosphoric acid.

Referring to FIG. 5, a metal layer 28 may be selectively deposited on the poly-silicon layer 16 using an area-selective deposition method, and thus, the metal layer 28 may be formed to fill a region, from which the sacrificial layer 18 has been removed. In an implementation, the formation of the metal layer 28 may include forming a capping layer to partially fill the region, from which the sacrificial layer 18 has been removed, and performing a planarization process on the capping layer. In this case, a capping pattern may be formed on the metal layer 28. The metal layer 28 may be formed in such a way that it is used as a part of a gate electrode.

The fabrication method according to some embodiments may be used to fabricate a dynamic random access memory (DRAM) device.

Figure 6:
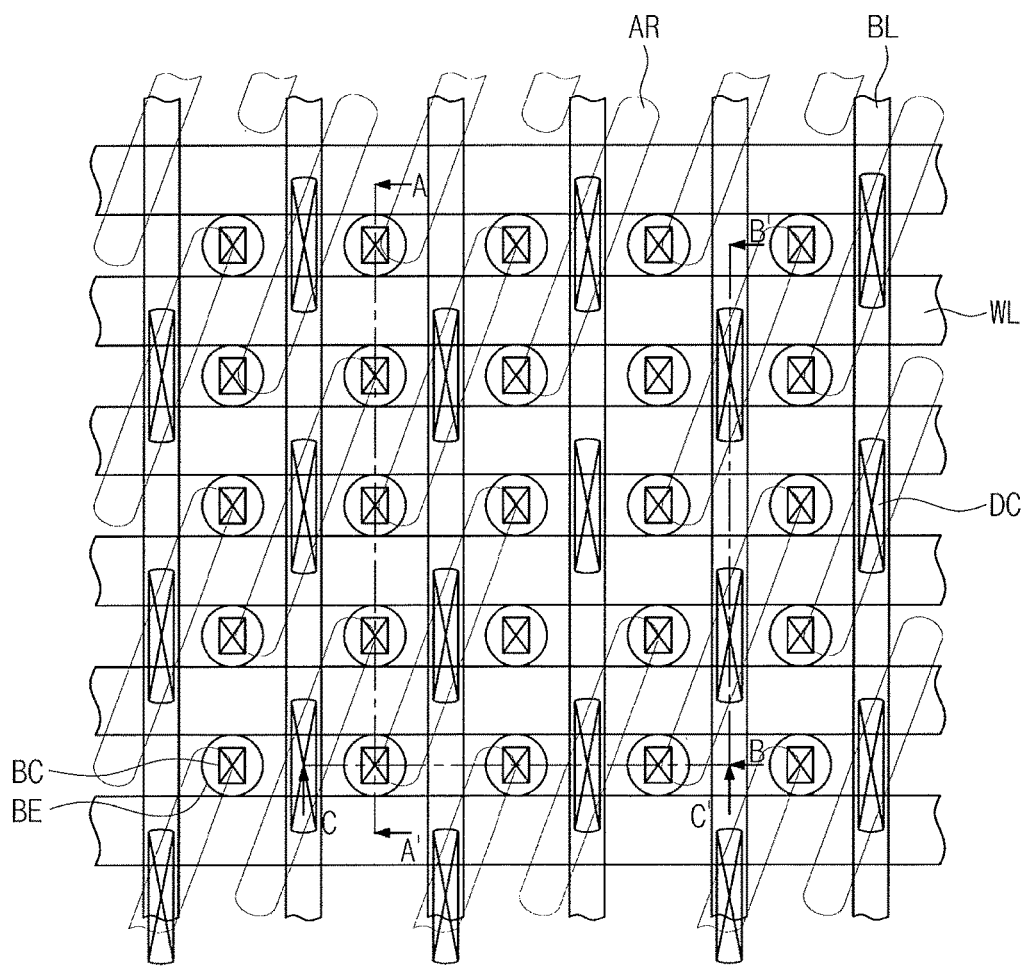
FIG. 6 illustrates a plan view of a semiconductor device according to some embodiments.
Figure 7:
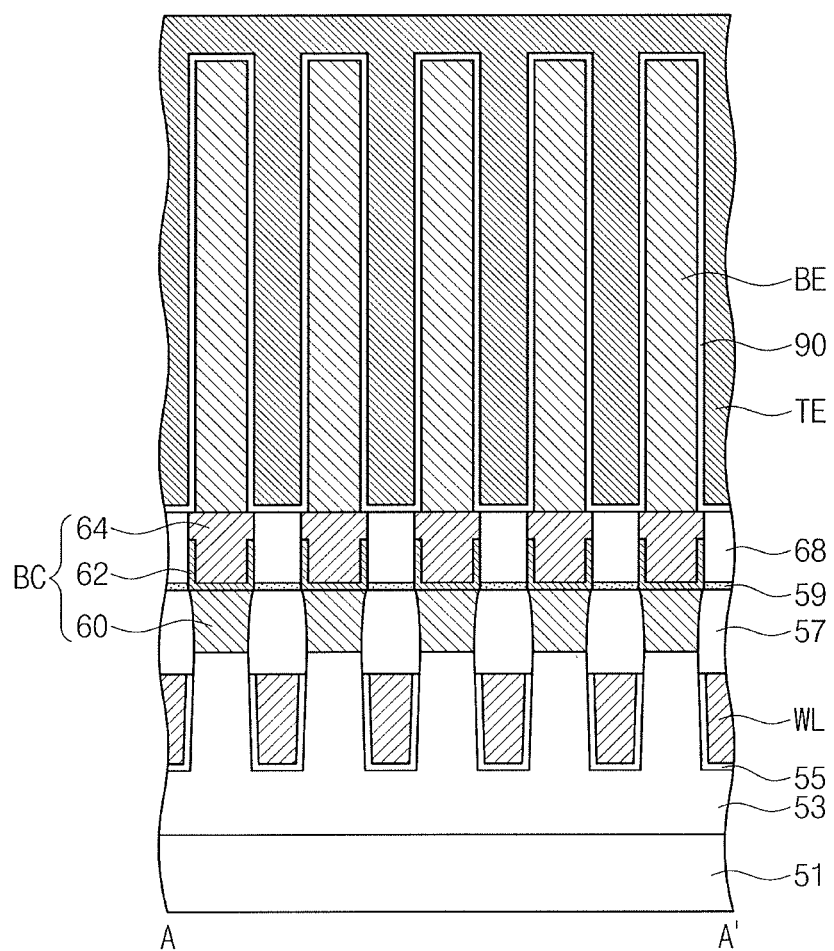
FIG. 7 illustrates a sectional view taken along line A-A' of FIG. 6.
Figure 8:
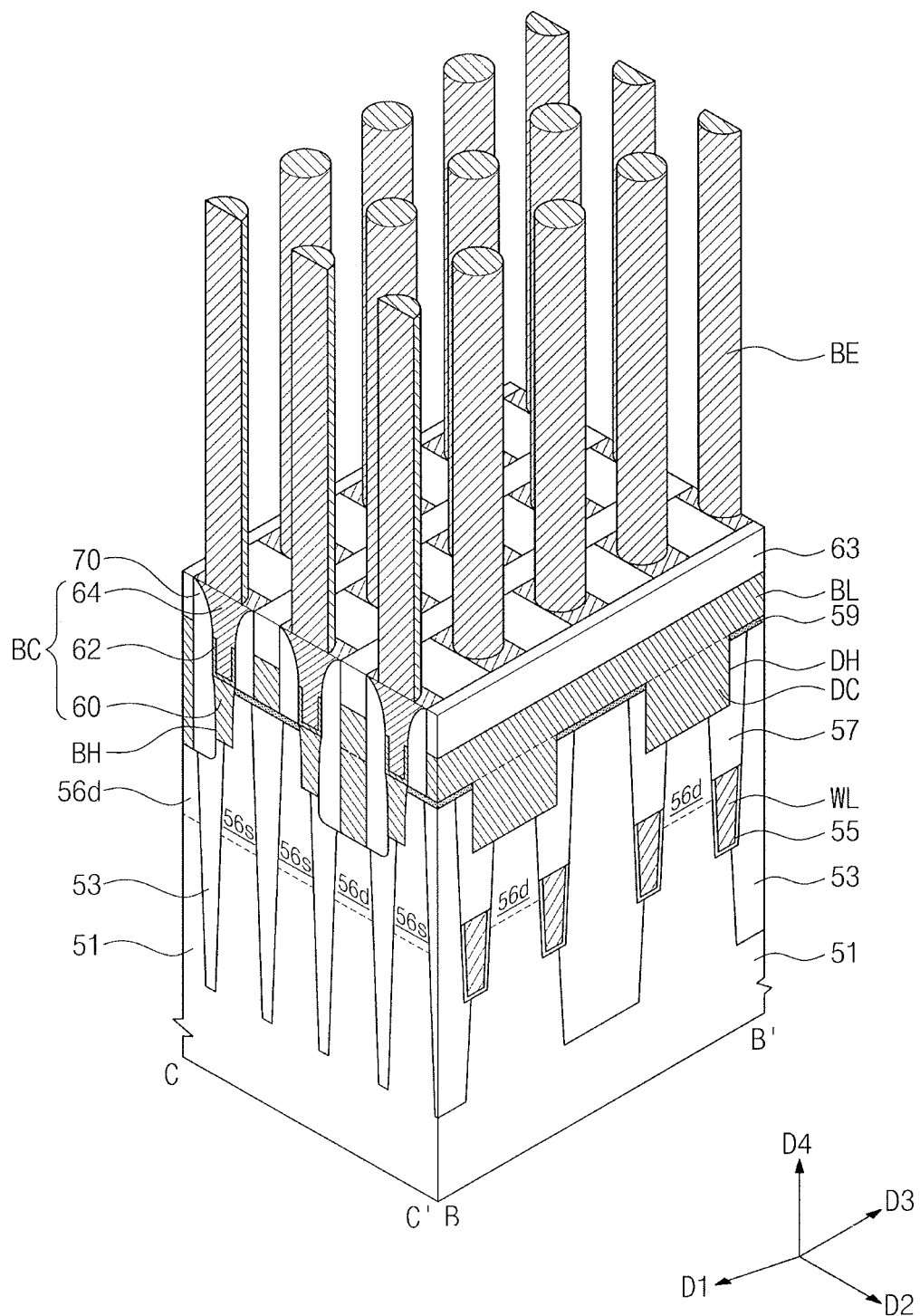
FIG. 8 illustrates a perspective view showing sections taken along lines B-B' and C-C' of FIG. 6.

A structure of the DRAM device according to some embodiments will first be described with reference to FIGS. 6 to 8. FIG. 6 illustrates a plan view of a semiconductor device according to some embodiments. FIG. 7 illustrates a sectional view taken along line A-A' of FIG. 6. FIG. 8 illustrates a perspective view showing sections taken along lines B-B' and C-C' of FIG. 6.

Referring to FIGS. 6 to 8, a device isolation layer 53 may be provided in a semiconductor substrate 51 to define an active region AR. In an implementation, when viewed in a plan view, a plurality of the active regions AR may be disposed to be parallel to each other and each of the active regions AR may have a bar shape extending in a first direction D1. A plurality of word lines WL may be provided in the substrate 51 to extend in a second direction D2 and to cross the active region AR and the device isolation layer 53. The word lines WL may be formed of or include, e.g., polysilicon, a metal silicide, or a metal. The second direction D2 may not be parallel to the first direction D1. The word lines WL may be provided in recessed regions, which are formed in the semiconductor substrate 51. A gate insulating layer 55 may be interposed between the word lines WL and the substrate 51. First and second doped regions 56s and 56d may be provided in the substrate 51 and at sides, e.g., both sides, of each of the word lines WL. First capping patterns 57 may be provided on the word lines WL, respectively.

A first insulating layer 59 may be disposed on the substrate 51. The first insulating layer 59 may be formed of or include, e.g., a silicon oxide layer, a silicon nitride layer, or a silicon oxynitride layer. Bit lines BL may be provided on the first insulating layer 59 to extend in a third direction D3 that is not parallel to either of the first and second directions D1 and D2. The bit lines BL may include a conductive material. Second capping patterns 63 may be disposed on the bit lines BL, respectively. The bit lines BL may be electrically connected to the second doped region 56d through bit line node contacts DC, which may penetrate the first insulating layer 59. The bit line node contacts DC may be provided in bit line node contact holes DH, respectively.

Storage node contacts BC may be provided between the bit lines BL to be in contact with the first doped regions 56s, respectively. Each of the storage node contacts BC may include a first contact pattern 60 and a second contact pattern 64. The first contact pattern 60 may be formed of polysilicon. The second contact pattern 64 may be formed of, e.g., a metallic material (e.g., tungsten). A diffusion barrier layer 62 may be interposed between the first contact pattern 60 and the second contact pattern 64. The diffusion barrier layer 62 may be formed of, e.g., titanium nitride. The storage node contact patterns BC may be provided in storage node contact holes BH, respectively.

Spacers 70 may be interposed between the bit lines BL and the storage node contacts BC and between the bit line node contacts DC and the storage node contacts BC.

A second insulating layer 68 may be provided on the first insulating layer 59. The second insulating layer 68 may be provided between the bit lines BL and between the storage node contacts BC. A capacitor including a lower electrode BE, a dielectric layer 90, and an upper electrode TE may be provided on each of the storage node contacts BC.

FIGS. 9 to 16 illustrate sectional views of stages in a process of fabricating a semiconductor device whose section is shaped as shown in FIG. 7, according to some embodiments.

Figure 9:
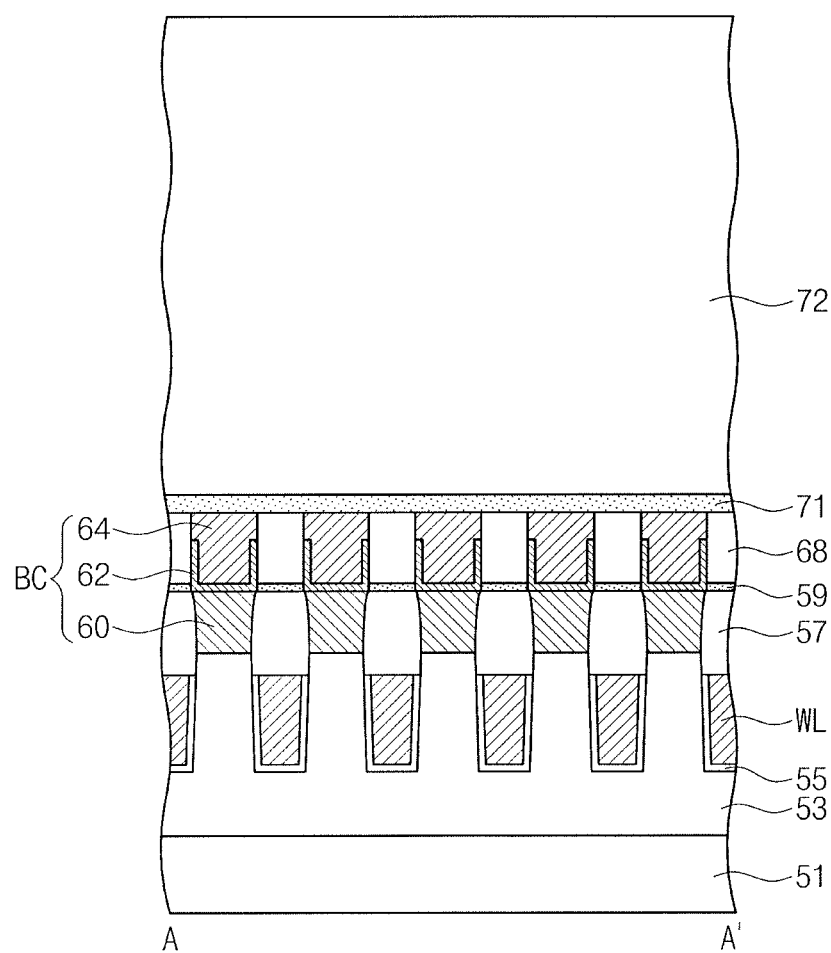
FIGS. 9 to 16 illustrate sectional views of stages in a process of fabricating a semiconductor device whose section is shaped as shown in FIG. 7, according to some embodiments.

Referring to FIGS. 6, 8, and 9, a device isolation layer 53 may be formed in a semiconductor substrate 51 to define an active region AR. The active region AR may have a bar-shaped structure elongated in a first direction D1. A plurality of line-shaped trench regions may be formed in the substrate 51, in which the device isolation layer 53 is formed. The trench regions may have a shape extending in a second direction D2, which is not parallel to the first direction D1. A gate insulating layer 55, a word line WL, and a first capping pattern 57 may be formed in each of the trenches. First and second doped regions 56s and 56d may be formed in exposed portions of the active region AR of the substrate 51, which are not covered with the first capping pattern 57.

A first insulating layer 59 may be formed on the substrate 51. An etching process may be performed to partially etch the first insulating layer 59, the substrate 51, the device isolation layer 53, and the first capping pattern 57, on regions overlapped with the second doped regions 56d, and as a result, bit line node contact holes DH may be formed. The bit line node contact holes DH may be formed in such a way that their bottom surfaces are positioned at higher than those of the second doped regions 56d and those of the first capping pattern 57. Thereafter, a conductive layer and a second capping layer may be sequentially formed on the first insulating layer 59 and may be patterned to form a plurality of line-shaped second capping patterns 63, a plurality of bit lines BL, and bit line node contacts DC. Here, the bit lines BL may be formed below the second capping patterns 63, respectively, and the bit line node contacts DC may be formed in the bit line node contact holes DH, respectively. Next, spacers 70 may be formed to cover sidewalls of the second capping pattern 63, the bit lines BL, and the bit line node contacts DC.

Next, a second insulating layer 68 may be formed to fill a space between the bit lines BL. The second insulating layer 68 and the first insulating layer 59 may be patterned to form a storage node contact hole BH exposing the first doped region 56s. A poly-silicon layer may be formed to fill the storage node contact hole BH and may be recessed to form a first contact pattern 60. A diffusion barrier layer 62 may be formed to cover a top surface of the first contact pattern 60. A second contact pattern 64 may be formed to fill the storage node contact hole BH. The second contact pattern 64 may be formed of a metal layer (e.g., tungsten) having electric resistance lower than that of the first contact pattern 60. A planarization process may be performed to expose top surfaces of the second contact pattern 64, the second insulating layer 68, and the second capping pattern 63.

An etch stop layer 71 and a mold layer 72 may be sequentially formed on the top surfaces of the second contact pattern 64, the second insulating layer 68, and the second capping pattern 63. The etch stop layer 71 may be formed of a material (e.g., silicon nitride) having an etch selectivity with respect to the mold layer 72. The mold layer 72 may be formed of, e.g., a silicon oxide layer or a tetraethoxysilane (TEOS) layer. In an implementation, the mold layer 72 may be formed of a poly-silicon layer.

Figure 10:
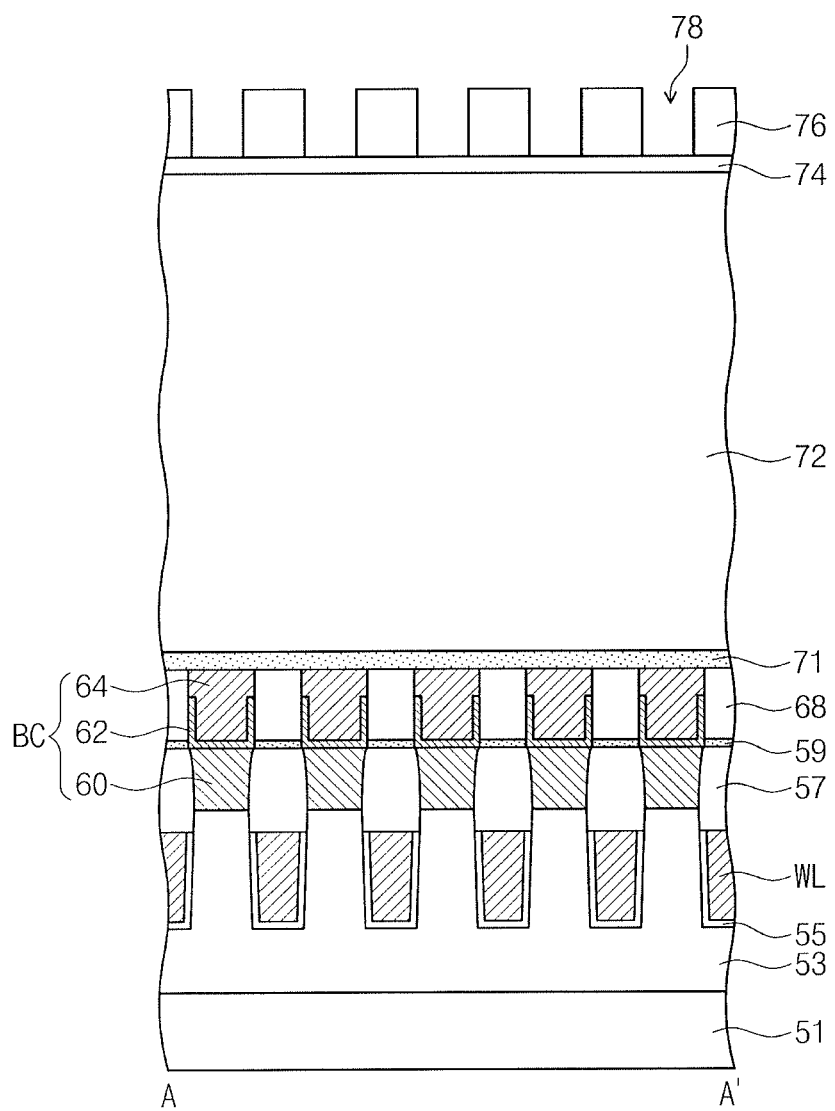
Figure 10:
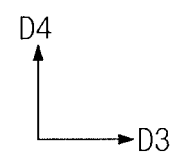

Referring to FIG. 10, a deposition active layer 74 may be formed on the mold layer 72. In an implementation, the deposition active layer 74 may be, e.g. a nonmetal layer which is formed of a substantially metal-free material. The deposition active layer 74 may have a role similar to that of the deposition active layer 3 of FIG. 1 and may be formed of, e.g., a poly-silicon layer. In the case where the mold layer 72 is formed of a poly-silicon layer, it is possible to omit the process of forming the deposition active layer 74. A sacrificial layer 76 may be formed on the deposition active layer 74. The sacrificial layer 76 may be formed of, e.g., a silicon oxide layer, a silicon nitride layer, or a silicon oxynitride layer. The sacrificial layer 76 may be etched to form a plurality of first openings 78, each of which has an island shape and is used to define a position of a lower electrode hole (formed later). The first openings 78 may be formed using a lattice-shaped mask pattern as an etch mask. The first openings 78 may partially expose a top surface of the deposition active layer 74.

Figure 11:
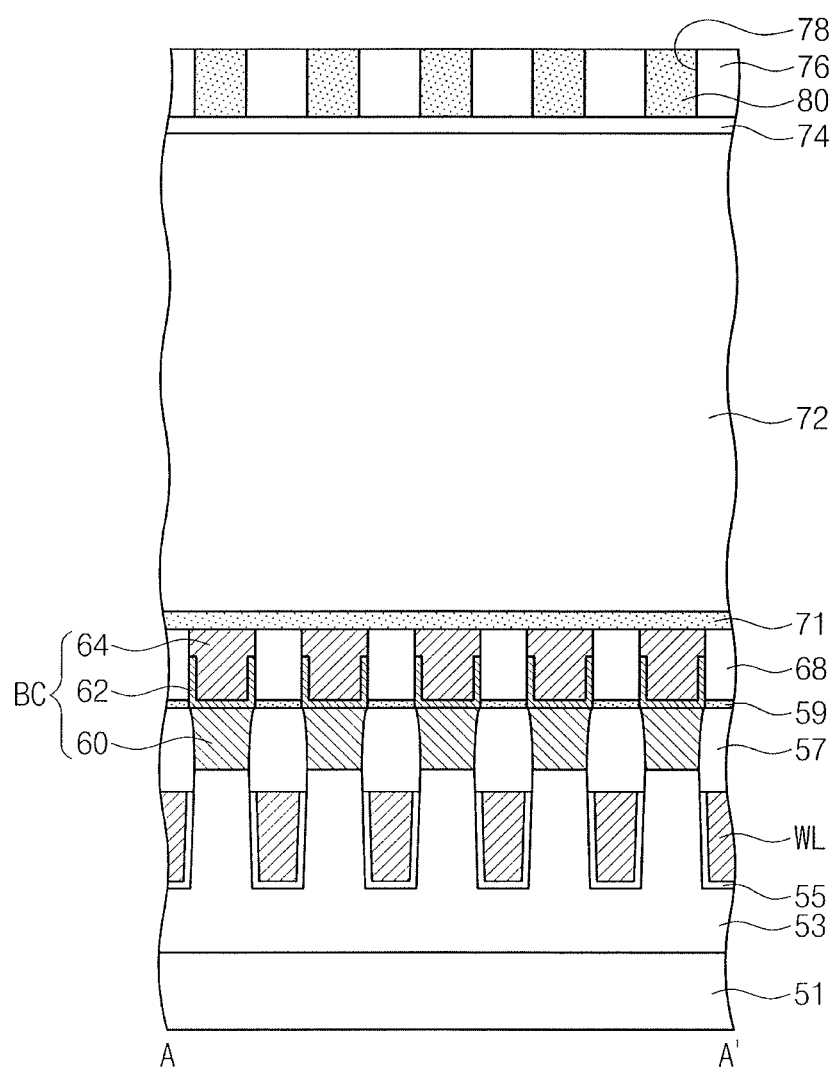
Figure 11:
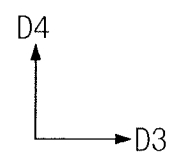

Referring to FIG. 11, guide patterns 80 may be formed to fill the first openings 78. In an implementation, the guide patterns 80 may be formed of or include a hydrocarbon-based insulating material (e.g., a spin-on-hardmask (SOH) or a spin-on-carbon (SOC) material). The formation of the guide patterns 80 may include forming the SOH or SOC layer with a good gap-fill property using a spin coating method, drying or baking the SOH or SOC layer, and performing an etch-back process to expose a top surface of the sacrificial layer 76.

Figure 12:
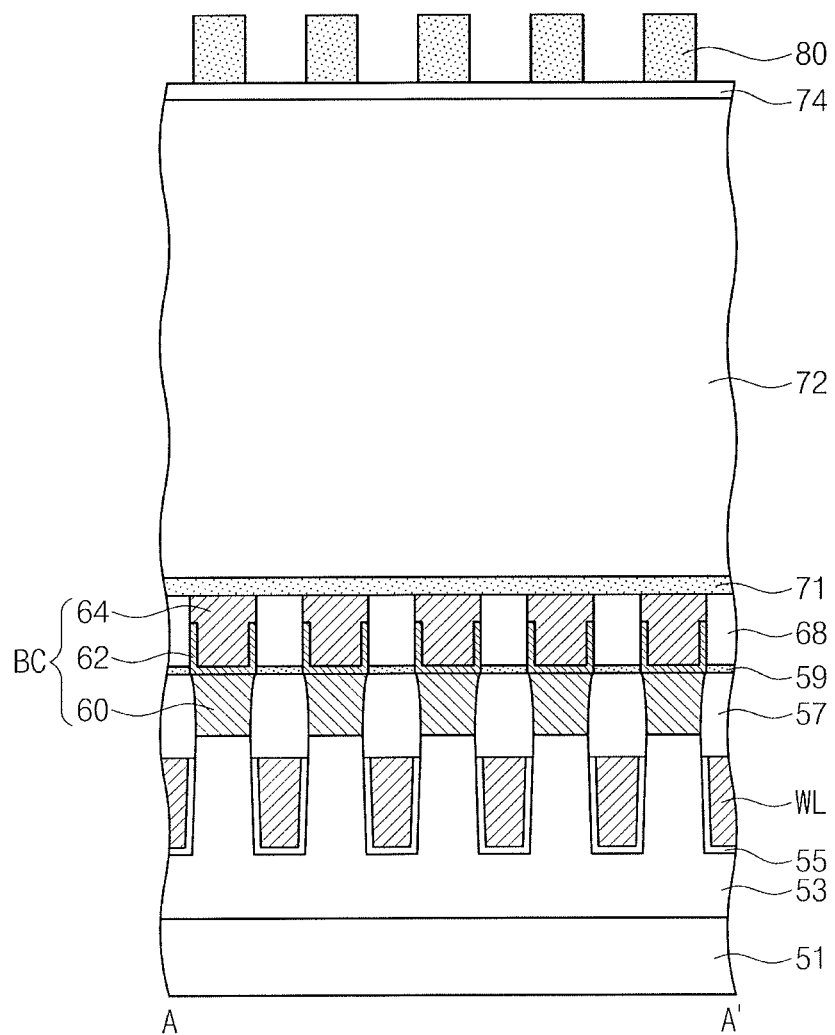

Referring to FIG. 12, the sacrificial layer 76 may be removed to expose the top surface of the deposition active layer 74 and a side surface of the guide pattern 80. In the case where the sacrificial layer 76 is formed of a silicon oxide layer, the sacrificial layer 76 may be removed using hydrofluoric acid or LAL solution. As a result of the removal of the sacrificial layer 76, a plurality of the guide patterns 80, which may be shaped like or arranged as islands and are spaced apart from each other, may remain on the deposition active layer 74.

Figure 13:
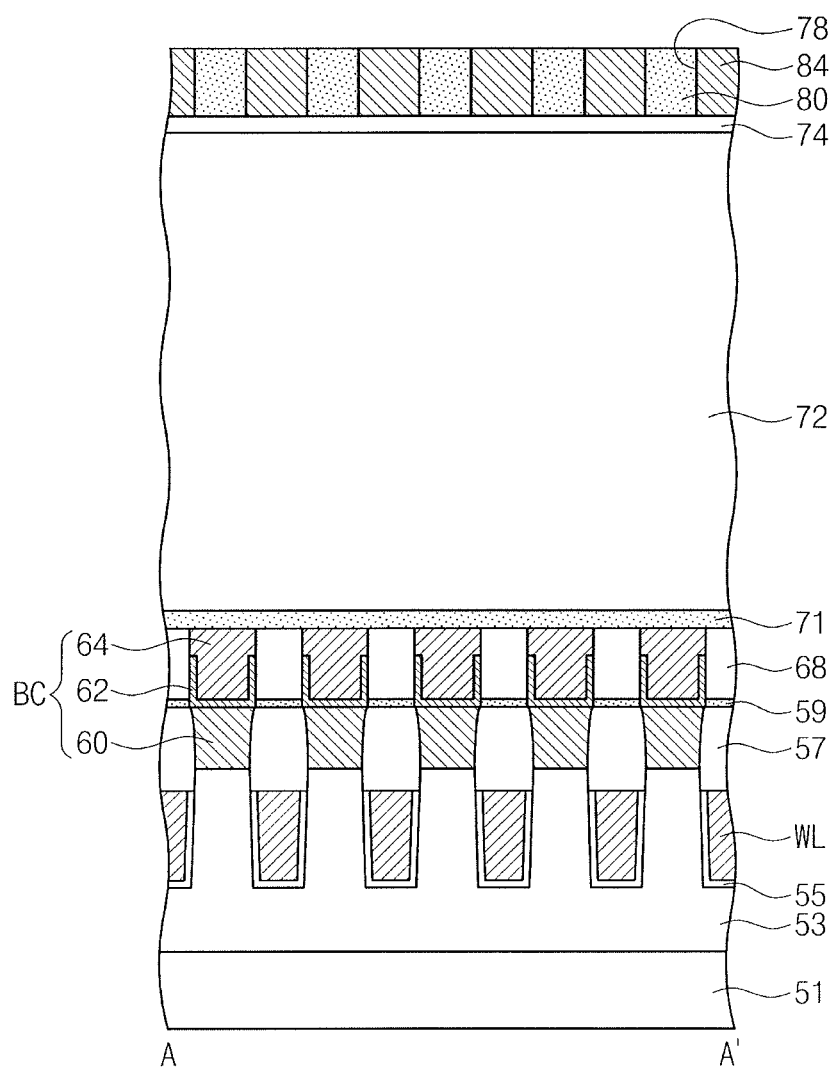
Figure 13:
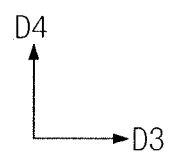

Referring to FIG. 13, an area-selective deposition process may be performed to selectively deposit a metal mask pattern 84 on the deposition active layer 74 between the guide patterns 80. As a result, the metal mask pattern 84 may have substantially the same shape as the sacrificial layer 76 (which was removed in a previous step).

Figure 14:
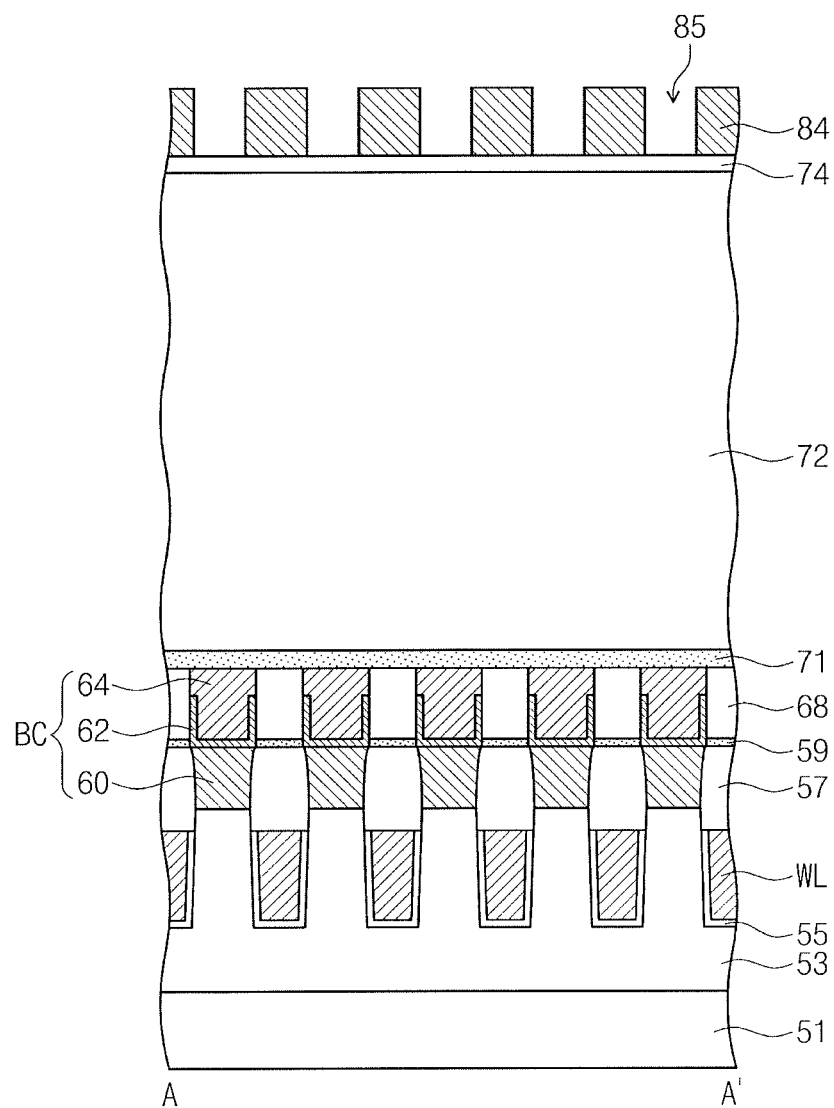

Referring to FIG. 14, the guide patterns 80 may be removed to form second openings 85 in the metal mask pattern 84. The second openings 85 may expose the top surface of the deposition active layer 74.

Figure 15:
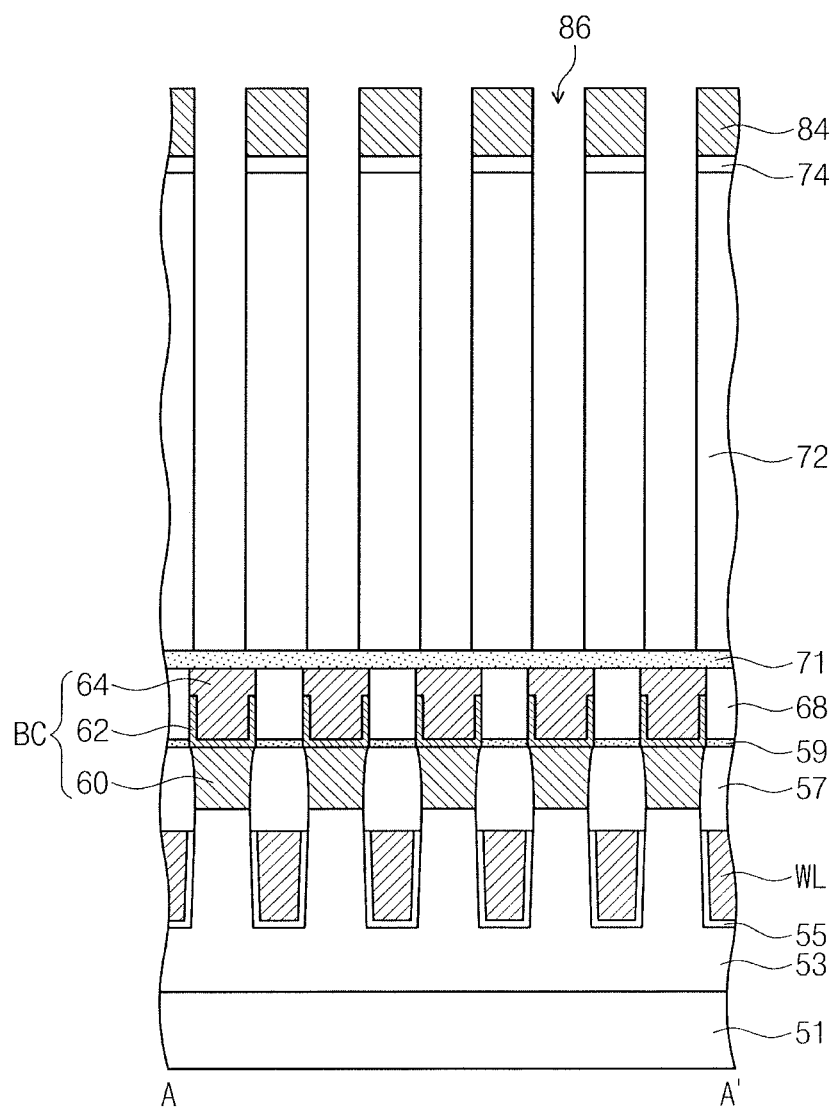

Referring to FIG. 15, the deposition active layer 74 exposed by the second openings 85 and the mold layer 72 thereunder may be sequentially etched using the metal mask pattern 84 as an etch mask to form lower electrode holes 86. The lower electrode holes may expose the etch stop layer 71 and may have substantially the same shape (e.g., in plan view) as the second openings 85.

A width of a lower electrode of a capacitor may decrease with increasing density of a semiconductor device, but in order to allow the capacitor to have sufficient capacitance, it may be necessary to increase a vertical length of the lower electrode. For this, the lower electrode holes 86 may have a high aspect ratio. In an implementation, the metal mask pattern 84 may be formed by the area-selective deposition method, there may be no need to etch a metal layer, and thus it is possible to prevent an etching failure, which could be caused by grains in a metal layer. In addition, the lower electrode holes 86 may be formed using the metal mask pattern 84 having a good etch selectivity, and it is possible to form the lower electrode holes 86 in a desired shape.

Figure 16:
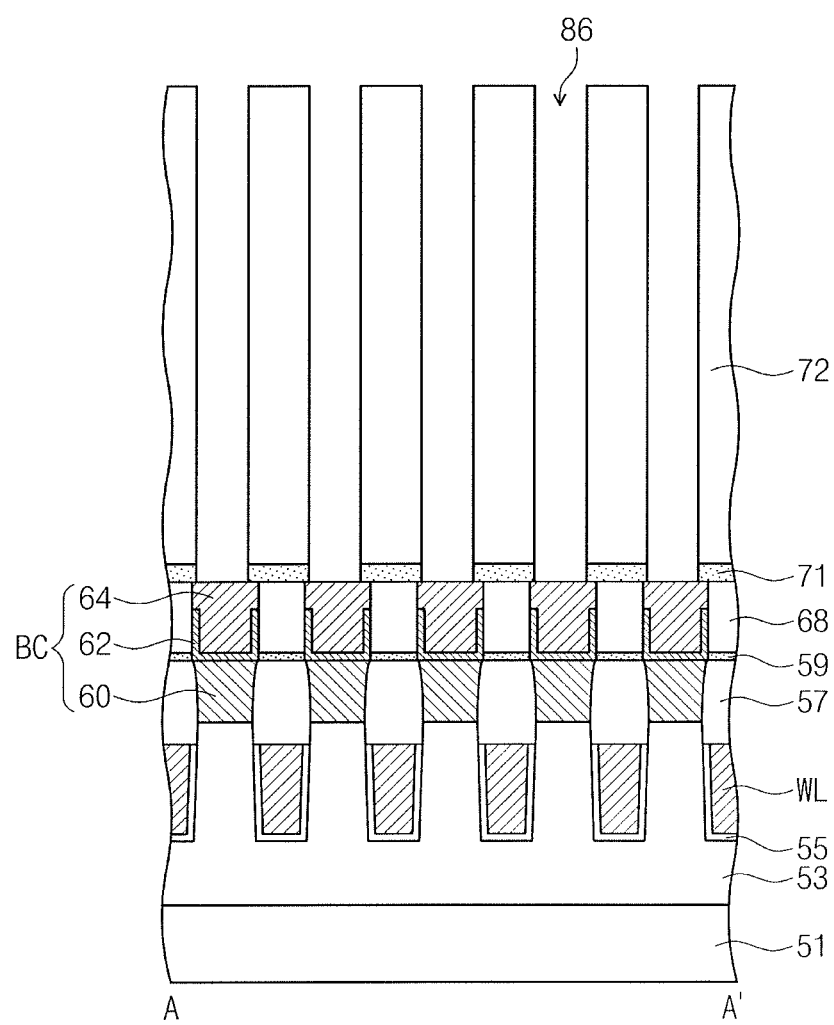

Referring to FIG. 16, the metal mask pattern 84 and the deposition active layer 74 may be etched to expose the mold layer 72. Thereafter, the etch stop layer 71 in the lower electrode hole 86 may be removed to expose the top surface of the second contact pattern 64.

Referring back to FIG. 7, a conductive layer may be deposited to fill the lower electrode holes 86, and then, a planarization etching process may be performed on the conductive layer to form a lower electrode BE in each of the lower electrode holes 86. The mold layer 72 may be removed to expose the lower electrodes BE. On the semiconductor substrate 51, a dielectric layer 90 may be formed to conformally cover an exposed surface of the lower electrode BE. An upper electrode TE may be formed on the dielectric layer 90 to fill a gap between the lower electrodes BE.

In an implementation, to help prevent the lower electrodes BE from falling or leaning when the mold layer 72 is removed, a supporting layer may be additionally formed in the mold layer 72. The supporting layer may not be removed when the mold layer 72 is removed, and thus, after the removal of the mold layer 72, the supporting layer may be in contact with a portion of a side surface of the lower electrodes BE and may help prevent the lower electrodes BE from falling or leaning.

The fabrication method according to some embodiments may be used to fabricate a vertical-type semiconductor memory device. To begin with, a structure of a vertical-type semiconductor memory device according to some embodiments will be described with reference to FIGS. 17 to 19.

Figure 17:
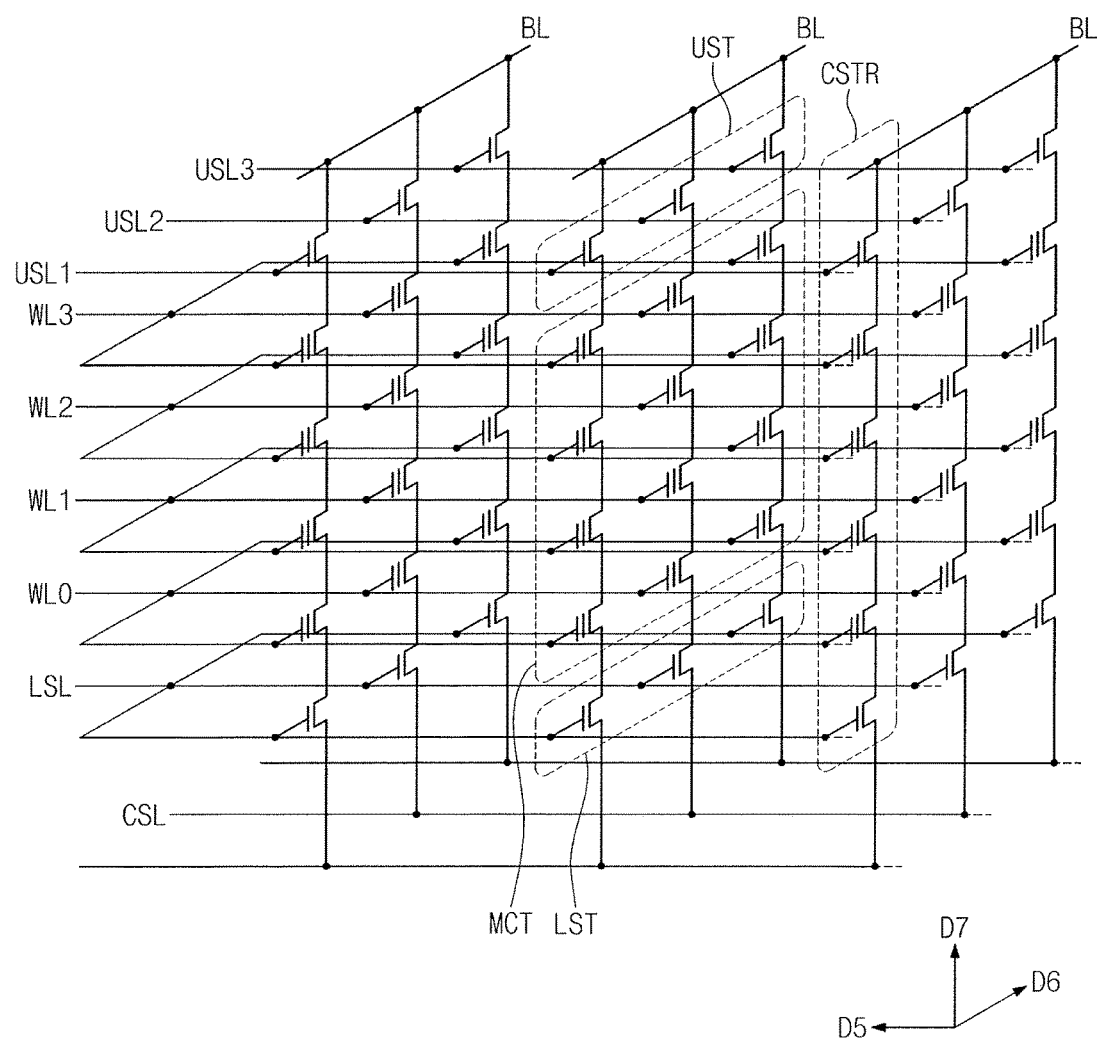
FIG. 17 illustrates a circuit diagram of a semiconductor device according to some embodiments.
Figure 18:
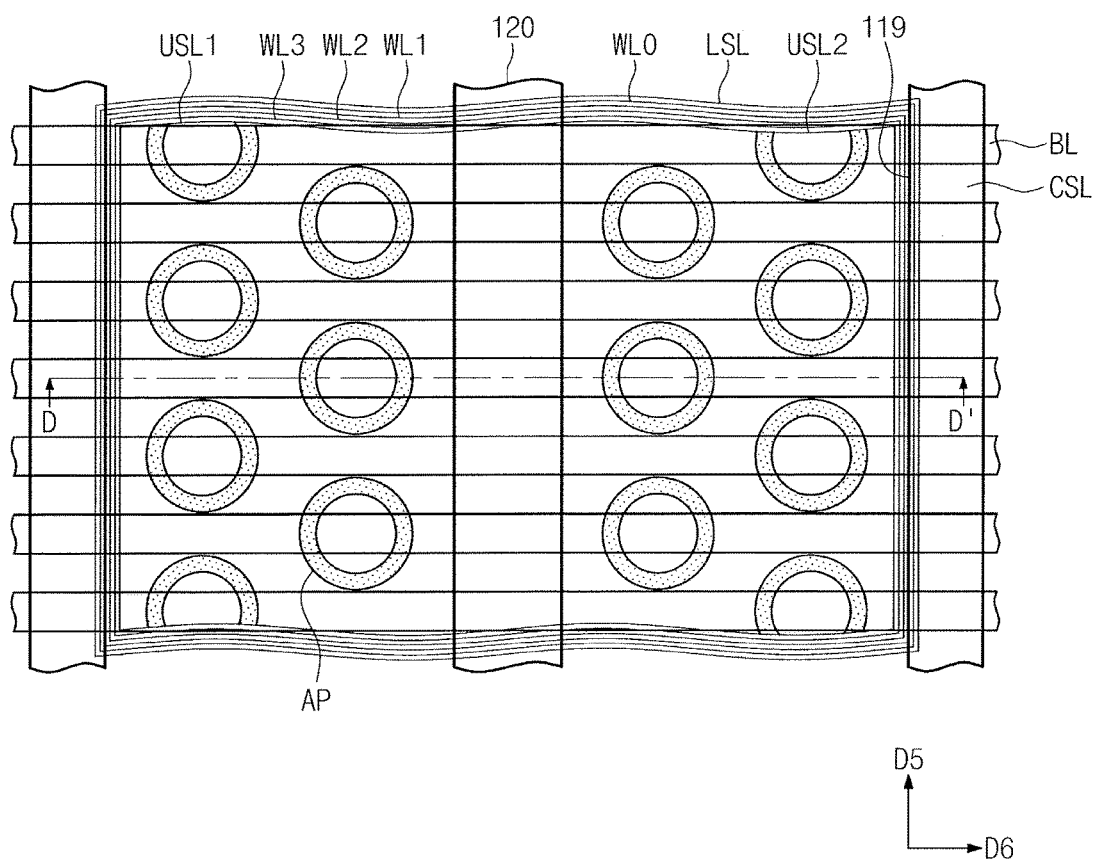
FIG. 18 illustrates a plan view of a semiconductor device according to some embodiments.
Figure 19:
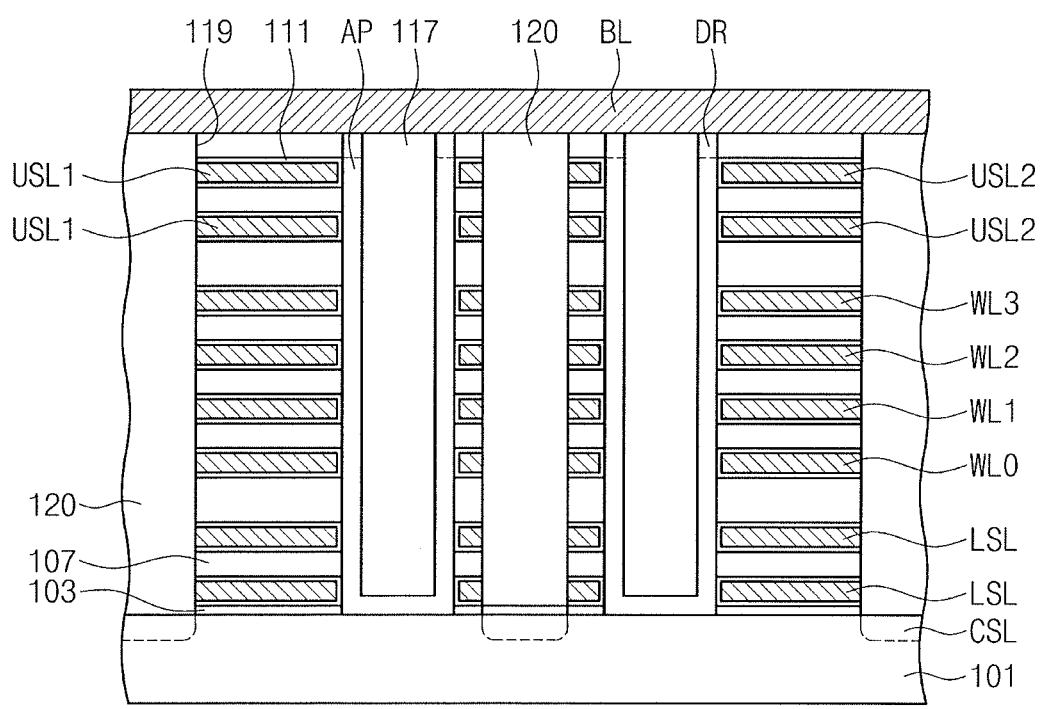
FIG. 19 illustrates a sectional view taken along line D-D' of FIG. 18.

FIG. 17 illustrates a circuit diagram of a semiconductor device according to some embodiments. FIG. 18 illustrates a plan view of a semiconductor device according to some embodiments. FIG. 19 illustrates a sectional view taken along line D-D' of FIG. 18.

Referring to FIGS. 17 to 19, a vertical-type semiconductor memory device may include a common source line CSL, a plurality of bit lines BL0, BL1, and BL2, and a plurality of cell strings CSTR provided between the common source line CSL and the bit lines BL.

The common source line CSL may be a doped region formed in a semiconductor substrate 101. The semiconductor substrate 101 may be a semiconductor wafer or an epitaxial semiconductor layer formed on the semiconductor wafer. The bit lines BL may be conductive lines, which are spaced apart upward from the semiconductor substrate 101. The bit lines BL may be arranged on at least one two-dimensional plane, and a plurality of the cell strings CSTR may be connected in parallel to each of the bit lines BL. Accordingly, the cell strings CSTR may be two-dimensionally arranged on the semiconductor substrate 101.

Each of the cell strings CSTR may include a lower selection transistor LST coupled to the common source line CSL, an upper selection transistor UST coupled to a corresponding one of the bit lines BL, and a plurality of memory cell transistors MCI provided between the lower and upper selection transistors LST and UST. The lower selection transistor LST, the upper selection transistor UST, and the memory cell transistors MCI may be connected in series to each other in a direction normal to a top surface of the semiconductor substrate 101. Furthermore, a lower selection line LSL, a plurality of word lines WL0-WL3, and a plurality of upper selection lines USL1-USL3 may be provided between the common source line CSL and the bit lines BL and may be respectively used as gate electrodes of the lower selection transistor LST, the memory cell transistors MCT, and the upper selection transistors UST. In an implementation, the common source lines CSL, the lower selection line LSL, the word lines WL, and the upper selection lines USL1-USL3 may extend in a first direction D5. The bit lines BL may extend in a second direction D6 which is not parallel to the first direction D5.

The lower selection transistors LST may be provided at substantially the same distance from the semiconductor substrate 101, and the gate electrodes thereof may be connected in common to the lower selection line LSL, thereby being in an equipotential state. Similarly, the gate electrodes of the memory cell transistors MCT located at the same distance from the common source line CSL may also be connected in common to one of the word lines WL0-WL3, thereby being in an equipotential state. Each of the cell strings CSTR may include a plurality of the memory cell transistors MCT provided at different distances from the common source line CSL, and the word lines WL0-WL3 between the common source line CSL and the bit lines BL may be provided in a multi-layered structure.

Each of the cell strings CSTR may include a channel pillar AP, which is vertically extended from the semiconductor substrate 101 and is coupled to a corresponding one of the bit lines BL. The channel pillar AP may be formed to penetrate the upper selection lines USL1-USL3, the lower selection line LSL, and the word lines WL0-WL3.

A gate insulating layer 111 may be provided between the lines USL1-USL3, LSL, and WL0-WL3 and the channel pillar AP. The gate insulating layer 111 may include a tunnel insulating layer, a charge trap layer, and a blocking insulating layer. In an implementation, the charge trap layer may not be provided between the lower selection line LSL and the channel pillar AP or between the upper selection lines USL1-USL3 and the channel pillar AP. A drain region DR may be provided on or in a top portion of the channel pillar AP.

The lower and upper selection transistors LST and UST and the memory cell transistors MCT may be metal-oxide-semiconductor field effect transistors (MOSFETs), and the channel pillars AP may be used as channel regions of such MOSFETs. The channel pillar AP may be a cup-shaped structure. A first insulating gap-filling pattern 117 may be provided to fill an inner space of the channel pillar AP. The upper selection lines USL1-USL3 may be provided at two different levels, and the lower selection lines LSL may be provided at two different levels.

A buffer oxide layer 103 may be provided on the substrate 101. A gate interlayered insulating layer 107 may be provided on the upper selection lines USL1-USL3, between the upper selection lines USL1-USL3, between the upper selection lines USL1-USL3 and the word line WL3, between the word lines WL0-WL3, and between the word line WL0 and the lower selection line LSL, and between the lower selection lines LSL. A second insulating gap-filling pattern 120 may be provided between the upper selection lines USL1-USL3, between the word lines WL0-WL3, and between the lower selection lines LSL and may be used to separate them from each other. The common source line CSL may be provided in a portion of the substrate 101 located below the second insulating gap-filling pattern 120.

FIGS. 20 to 31 illustrate sectional views of stages in a process of fabricating a semiconductor device whose section is shaped as shown in FIG. 19, according to some embodiments.

Figure 20:
FIGS. 20 to 31 illustrate sectional views of stages in a process of fabricating a semiconductor device whose section is shaped as shown in FIG. 19, according to some embodiments.

Referring to FIG. 20, a buffer oxide layer 103 may be formed on a semiconductor substrate 101. First sacrificial layers 105 and gate interlayered insulating layers 107 may be alternately stacked on the buffer oxide layer 103. The first sacrificial layers 105 may be formed of a material that has an etch selectivity with respect to the gate interlayered insulating layers 107. For example, the gate interlayered insulating layers 107 may be formed of a silicon oxide layer, and the first sacrificial layers 105 may be formed of a silicon nitride layer.

Figure 21:
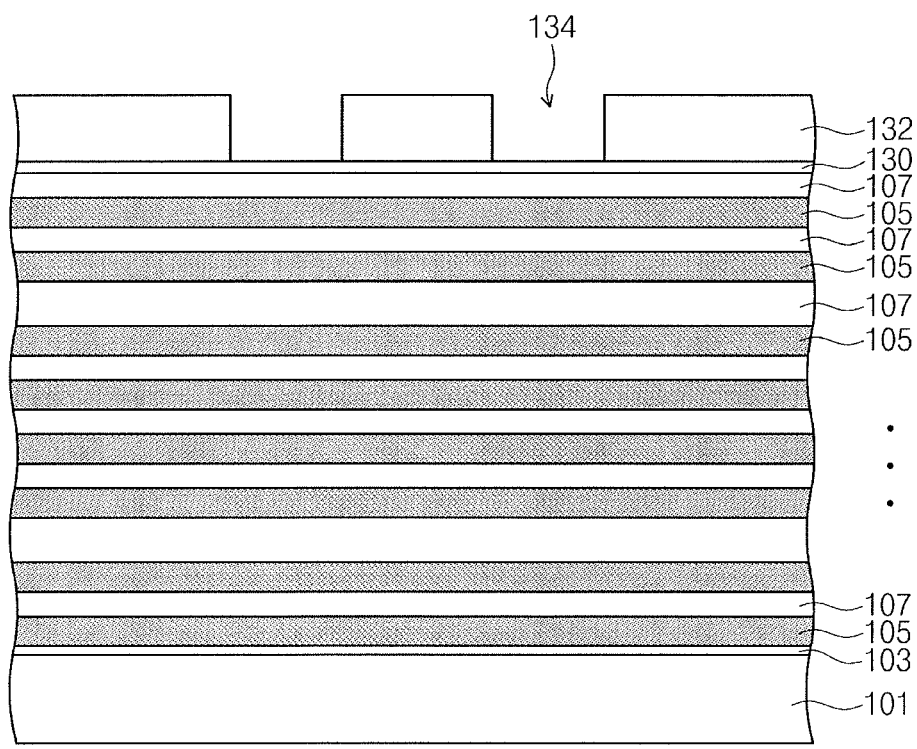

Referring to FIG. 21, a first deposition active layer 130 may be formed on the uppermost layer of the gate interlayered insulating layers 107. The first deposition active layer 130 may be a nonmetal layer which is formed of a substantially metal-free material. For example, the first deposition active layer 130 may be formed of a poly-silicon layer. A second sacrificial layer 132 may be formed on the first deposition active layer 130. The second sacrificial layer 132 may be formed of, e.g., a silicon oxide layer, a silicon nitride layer, or a silicon oxynitride layer. The second sacrificial layer 132 may be etched to form a plurality of island-shaped first openings 134, which may be used to define positions of channel holes. Each of the first openings 134 may expose a portion of a top surface of the first deposition active layer 130.

Figure 22:
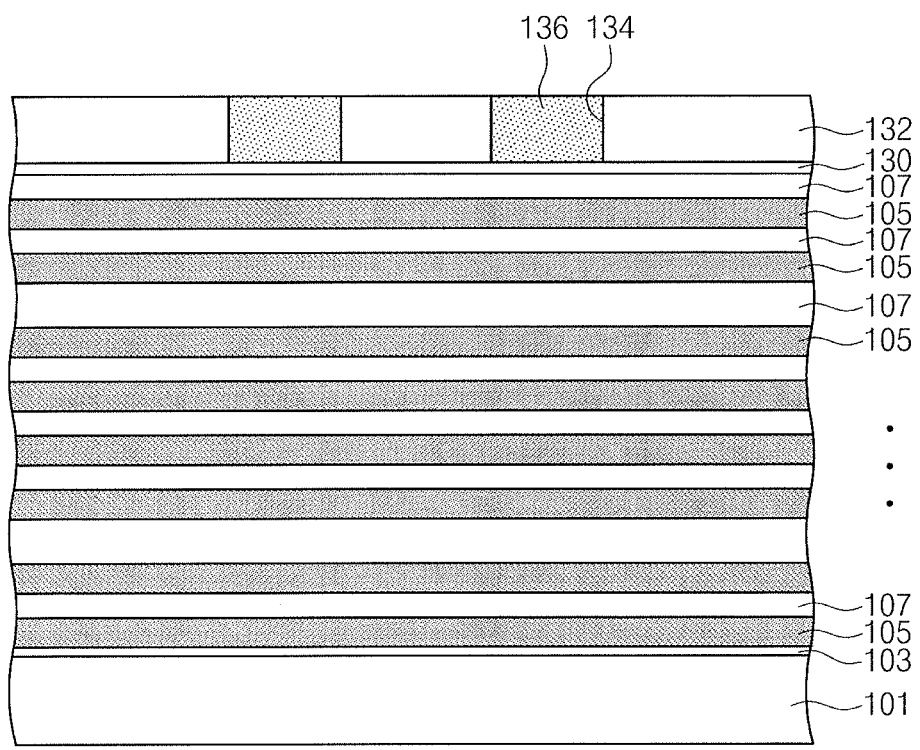

Referring to FIG. 22, first guide patterns 136 may be formed to fill the first openings 134. The first guide patterns 136 may be formed of or include, e.g., a hydrocarbon-based material (e.g., a SOH or a SOC material).

Figure 23:
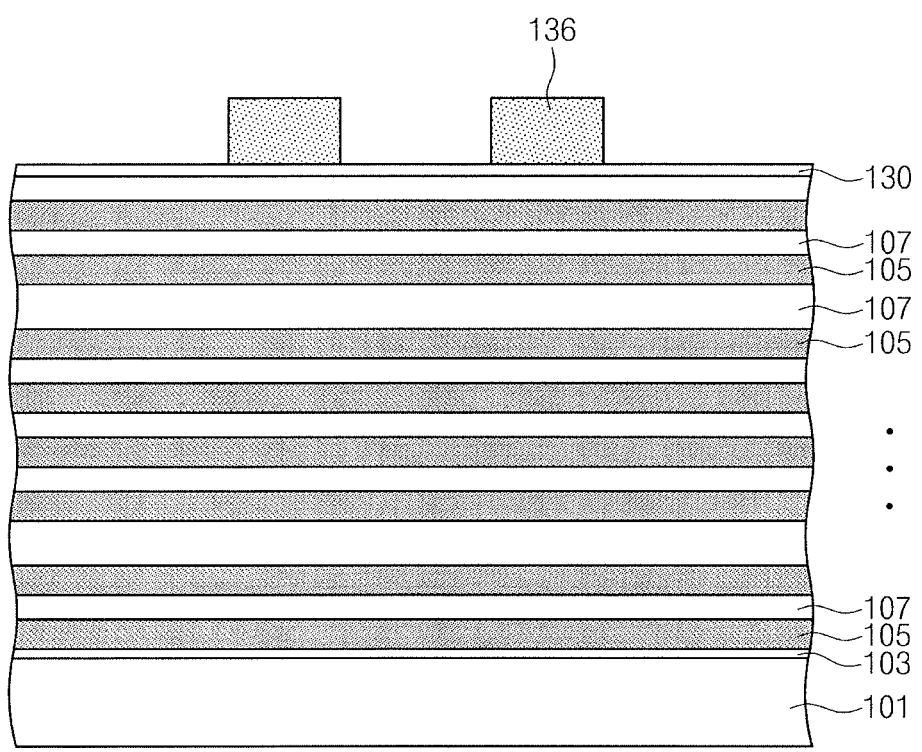

Referring to FIG. 23, the second sacrificial layer 132 may be removed to expose the top surface of the first deposition active layer 130 and a side surface of the second sacrificial layer pattern 136.

Figure 24:
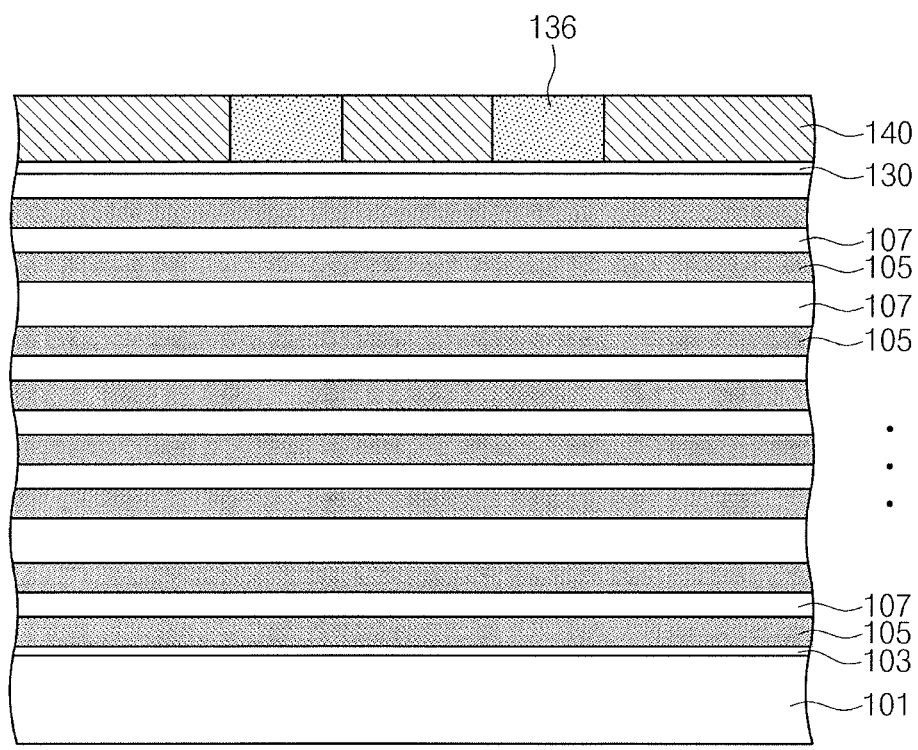

Referring to FIG. 24, an area-selective deposition process may be performed to selectively deposit a first metal mask pattern 140 on the first deposition active layer 130 between the first guide patterns 136. As a result, the first metal mask pattern 140 may have substantially the same shape as the (previously-removed) second sacrificial layer 132.

Figure 25:
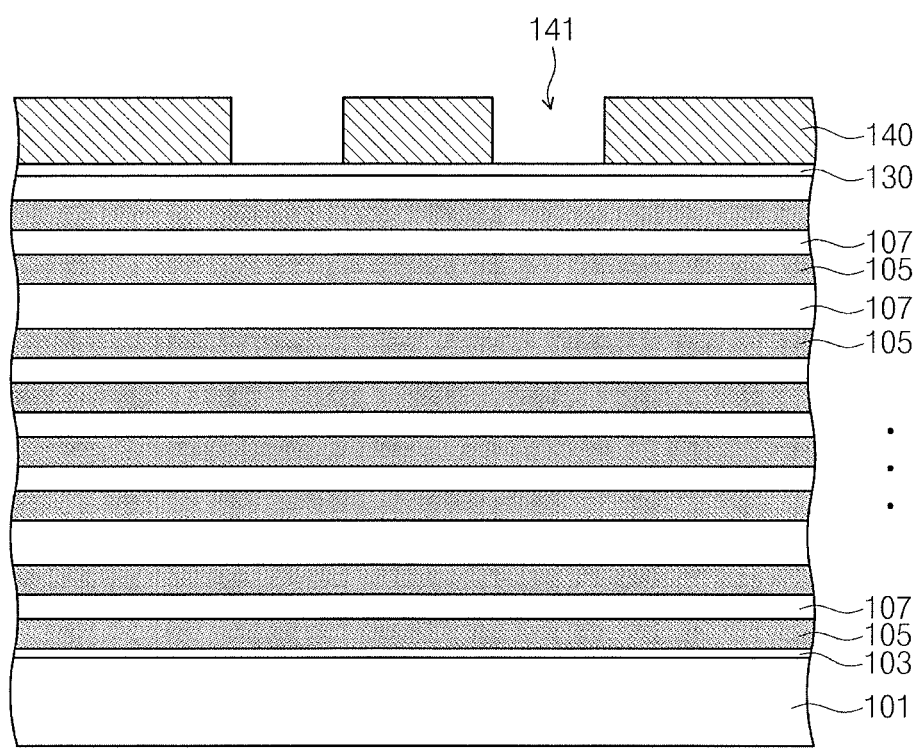

Referring to FIG. 25, the first guide patterns 136 may be removed to form second openings 141 in the first metal mask pattern 140. The second openings 141 may expose the top surface of the first deposition active layer 130.

Figure 26:
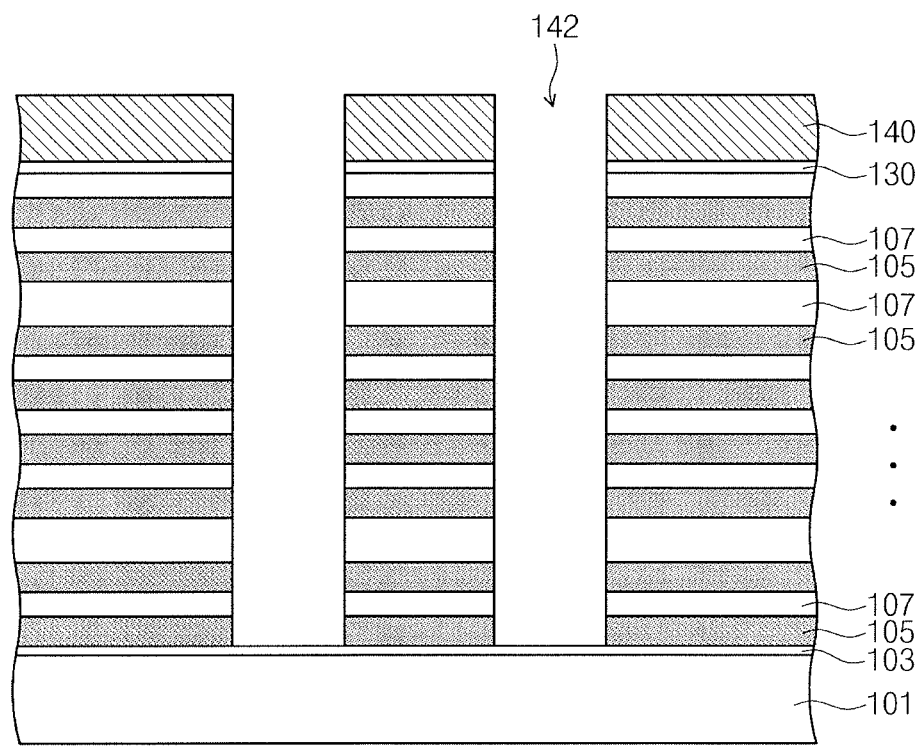

Referring to FIG. 26, portions of the first deposition active layer 130, the gate interlayered insulating layers 107, and the sacrificial layers 105, which are exposed by or located below the second openings 141, may be sequentially etched using the first metal mask pattern 140 as an etch mask, and thus, channel holes 142 may be formed to expose the buffer oxide layer 103 and to have substantially the same shape (in plan view) as the second openings 141.

Figure 27:
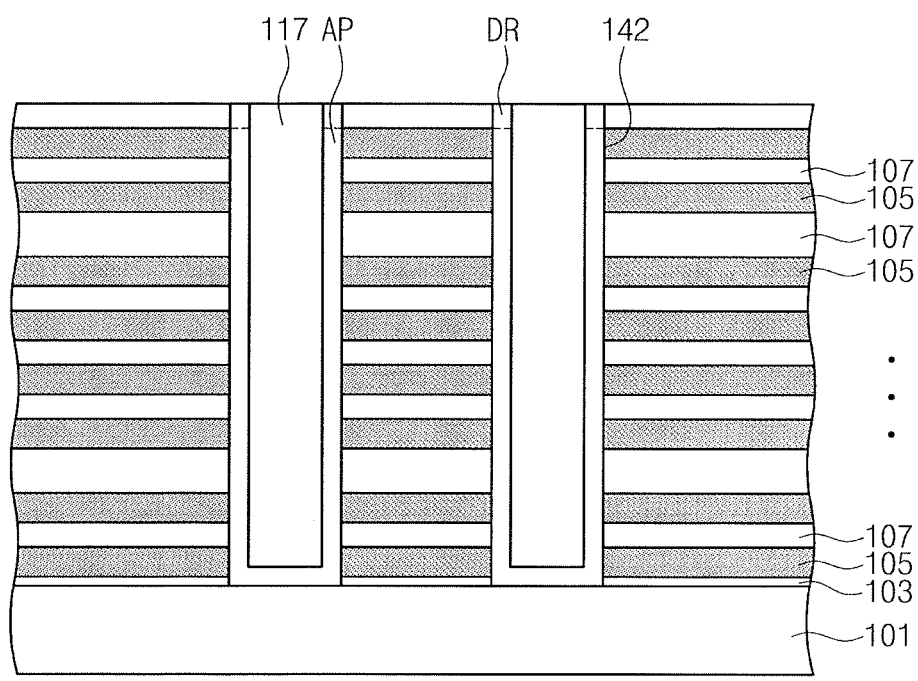

Referring to FIG. 27, the first metal mask pattern 140 and the first deposition active layer 130 may be removed. Thereafter, portions of the buffer oxide layer 103 exposed by the channel holes 142 may be removed to expose the semiconductor substrate 101. A channel layer may be formed to conformally cover side and bottom surfaces of the channel holes 142. The channel layer may be a semiconductor layer. For example, the channel layer may be a single-crystalline silicon layer or a poly-crystalline silicon layer. An insulating layer may be formed to fill the channel holes 142 provided with the channel layer. A planarization etching process may be performed on the insulating layer and the channel layer to form a channel pillar AP and a first insulating gap-filling pattern 117 in each of the channel holes 142. In an implementation, an ion implantation process may be performed to form a drain region DR in a top portion of the channel pillar AP.

Figure 28:
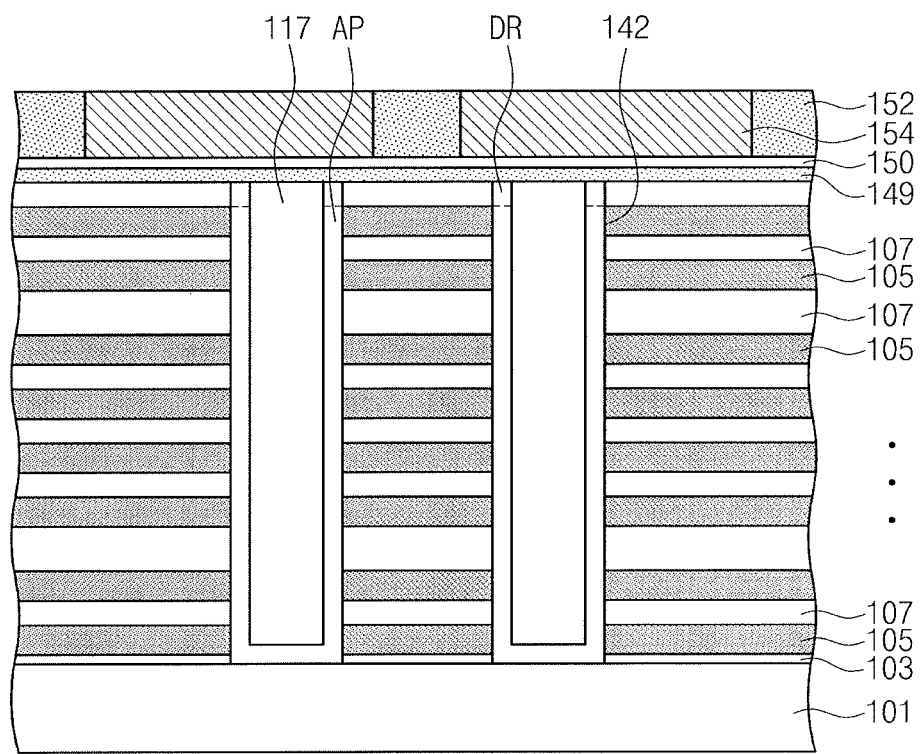

Referring to FIG. 28, a protection layer 149 may be formed to cover the channel pillar AP and the uppermost layer of the gate interlayered insulating layers 107. In an implementation, the protection layer 149 may be formed of a same material (e.g., silicon nitride) as the first sacrificial layers 105. A second deposition active layer 150 may be formed on the protection layer 149. The second deposition active layer 150 may be a nonmetal layer which is formed of a substantially metal-free material. The second deposition active layer 150 may be formed of, e.g., a poly-silicon layer. A second guide pattern 152 and a second metal mask pattern 154 may be formed on the second deposition active layer 150. The second guide pattern 152 may include a plurality of patterns, each of which has a line-shaped structure extending in the first direction D5. The second guide pattern 152 may be formed of, e.g., a silicon oxide layer, an SOH layer, or an SOC layer. The second metal mask pattern 154 may be formed by the same or similar method as that described above (e.g., using an area-selective deposition method).

Figure 29:
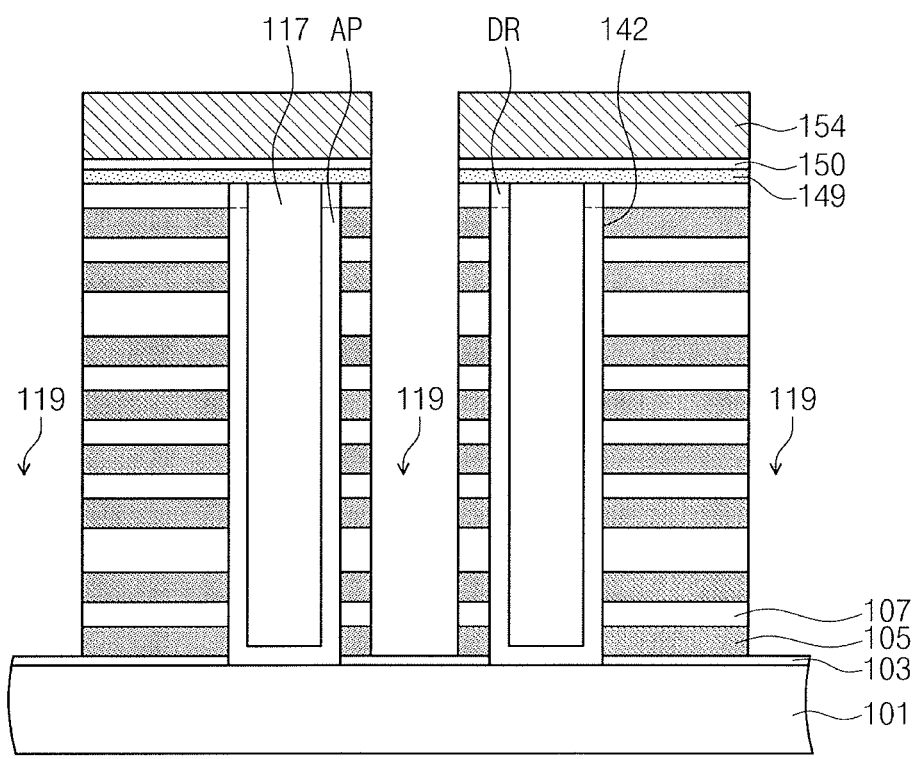

Referring to FIG. 29, the second guide pattern 152 may be selectively removed. A patterning process using the second metal mask pattern 154 as an etch mask may be performed to sequentially etch the second deposition active layer 150, the protection layer 149, the gate interlayered insulating layers 107, and the first sacrificial layers 105, which are stacked below the second metal mask pattern 154, and as a result, a plurality of grooves 119 may be formed to expose the buffer oxide layer 103.

Figure 30:
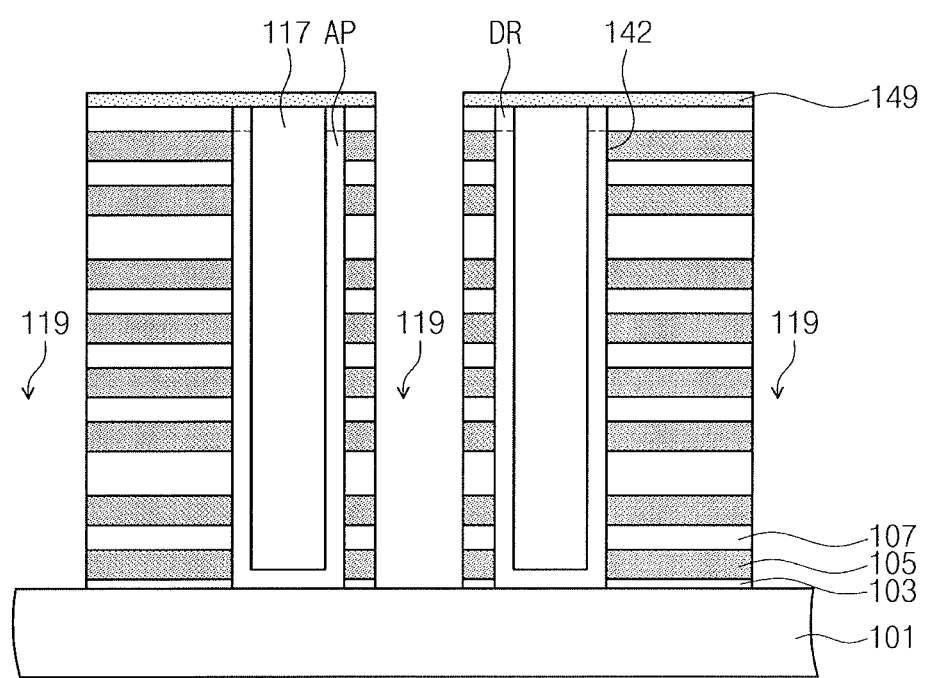

Referring to FIG. 30, the second metal mask pattern 154 and the second deposition active layer 150 may be removed to expose the top surface of the protection layer 149. The protection layer 149 may help prevent an upper portion of the channel pillar AP from being damaged or removed, when the second deposition active layer 150 is removed. The buffer oxide layer 103 exposed through the grooves 119 may be removed to expose the semiconductor substrate 101.

Figure 31:
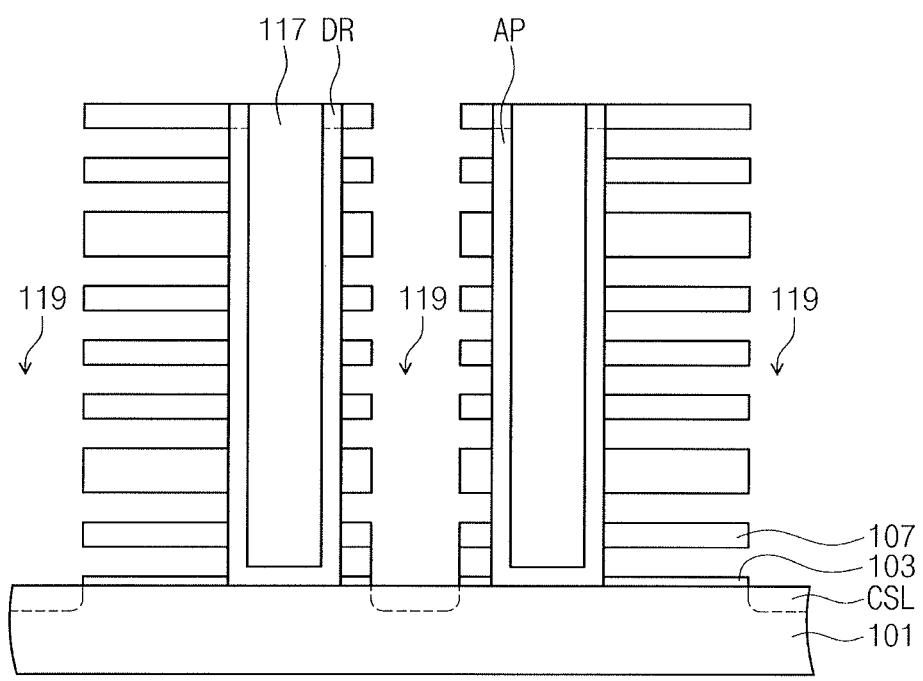

Referring to FIG. 31, an ion implantation process may be performed to form common source lines CSL in portions of the semiconductor substrate 101 exposed through the grooves 119. Thereafter, the first sacrificial layers 105 and the protection layer 149 may be removed to again expose the side surface of the channel pillar AP and the surfaces of the gate interlayered insulating layers 107.

Referring back to FIG. 19, a gate insulating layer 111 may be formed to conformally cover the exposed surfaces of the channel pillar AP and the gate interlayered insulating layers 107. A conductive layer may be formed to fill gap regions between the gate interlayered insulating layers 107. The conductive layer may be removed from the grooves 119, and an insulating layer may be formed to fill the grooves 119. Thereafter, a planarization etching process may be performed on the insulating layer, and as a result, lower selection lines LSL, word lines WL0-WL3, and upper selection lines USL1-USL3 may be formed between the gate interlayered insulating layers 107, and second insulating gap-filling patterns 120 may be formed in the grooves 119. Bit lines BL may be formed to electrically connect the drain regions DR to each other.

According to some embodiments, the first metal mask pattern 140 and the second metal mask pattern 154 may be formed using the area-selective deposition method, without an etching process on a metal layer. In addition, the use of the first and second metal mask patterns 140 and 154 may allow the channel holes 142 and the grooves 119, which have high aspect ratios, to be formed in desired shapes.

According to some embodiments, a method of fabricating a semiconductor device may include forming a metal layer using an area-selective deposition method, and this may make it possible to omit a process of etching a metal layer. Accordingly, it is possible to overcome an etching failure, which may be caused by crystal grains of a metal layer, and to form a pattern in a desired shape. In the case where a metal formed by this method is used for a hard mask, it is possible to form a high aspect ratio structure, such as a lower electrode hole of a DRAM device or a channel hole or a groove of a vertical-type semiconductor memory device, in a desired shape. Furthermore, this method may make it possible to deposit a metal layer in a thickness of a single atomic layer and consequently to more easily control a deposition rate, compared with a plating process. In addition, it is possible to omit a step of forming a seed layer, which may be needed in a plating process, and thereby to simplify the overall process of fabricating a semiconductor device.

By way of summation and review, higher integration of semiconductor devices may be desirable to satisfy consumer demands for superior performance and inexpensive prices. In order to realize a highly integrated semiconductor device, developing a patterning process capable of reducing a pattern width of patterns constituting a semiconductor device may be desirable, keeping in mind that a reduction in width of the patterns could lead to an increasing difficulty in precisely controlling a pattering process.

The embodiments may provide a precisely controllable patterning method.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:

forming a deposition active layer and a guide pattern on a semiconductor substrate such that the guide pattern delimits an exposed surface of the deposition active layer; and selectively depositing a metal-containing layer on the exposed surface of the deposition active layer exposed by the guide pattern, wherein the deposition active layer is a nonmetal layer, wherein the metal-containing layer is not deposited on a top surface of the guide pattern, and wherein selectively depositing the metal-containing layer includes repeating a process cycle a predetermined number of times, each process cycle including:

supplying a first source gas, the first source gas having a high adsorption rate on the deposition active layer and having a low adsorption rate on the guide pattern, purging the first source gas that is not adsorbed on the deposition active layer;

supplying a second source gas that contains a metallic element constituting the metal-containing layer and that reacts with molecules of the first source gas adsorbed on the deposition active layer, to form a metal-containing single atomic layer of the metal-containing layer on the deposition active layer; and purging the second source gas that does not react with the molecules of the first source gas.

2. The method as claimed in claim 1, wherein the deposition active layer is a single crystalline silicon layer that is doped with impurities or is undoped or a poly-crystalline silicon layer that is doped with impurities or is undoped.

3. The method as claimed in claim 1, wherein the guide pattern is formed of silicon oxide, silicon nitride, or a hydrocarbon-based material.

4. The method as claimed in claim 1, wherein the metal-containing layer is formed of tungsten (W), tungsten nitride (WN), tungsten carbide (WC), titanium (Ti), tantalum (Ta), aluminum (Al), or hafnium (Hf).

5. The method as claimed in claim 1, wherein:

the metal-containing layer is formed of tungsten, the first source gas includes hydrogen ($H_2$), monosilane ($SiH_4$), or diborane ($B_2H_6$), and the second source gas includes a tungsten halide or a tungsten-containing metal organic material.

6. The method as claimed in claim 1, further comprising forming a gate insulating layer on the semiconductor substrate prior to forming the deposition active layer and the guide pattern, wherein:

the deposition active layer is provided on the gate insulating layer and is a part of a gate electrode of the semiconductor device, the guide pattern is a spacer covering a sidewall of the gate electrode, and the metal-containing layer is provided on the deposition active layer and is another part of the gate electrode.

7. The method as claimed in claim 1, further comprising:
forming a mold layer on the semiconductor substrate prior to forming the deposition active layer and the guide pattern; and
removing the guide pattern and patterning the deposition active layer and the mold layer using the metal-containing layer as an etch mask after forming the metal-containing layer.

8. The method as claimed in claim 7, wherein:
forming the metal-containing layer includes forming a plurality of island-shaped holes that are spaced apart from each other in the metal-containing layer,
patterning the mold layer includes forming a plurality of lower electrode holes in the mold layer, and
the method further includes:
forming a lower electrode in each of the lower electrode holes;
removing the metal-containing layer, the deposition active layer, and the mold layer to expose a surface of the lower electrode;
forming a dielectric layer to cover the surface of the lower electrode; and
forming an upper electrode on the dielectric layer.

9. The method as claimed in claim 7, wherein:
forming the metal-containing layer includes forming a plurality of island-shaped holes that are spaced apart from each other in the metal-containing layer,
the mold layer includes gate interlayered insulating layers and sacrificial layers that are sequentially and alternately stacked one on another,
patterning the mold layer includes forming a plurality of channel holes in the mold layer, and
the method further includes:
forming a channel pillar in each of the channel holes;
removing the sacrificial layers to partially expose sidewalls of the channel pillar; and
forming a word line in a region that is formed by removing each of the sacrificial layers, and a gate insulating layer between the channel pillar and the word line.

10. The method as claimed in claim 7, wherein:
forming the metal-containing layer includes forming a plurality of line-shaped patterns that are spaced apart from and parallel to each other in the metal-containing layer,
the mold layer includes gate interlayered insulating layers and sacrificial layers that are sequentially and alternately stacked one on another,
patterning the mold layer includes forming a plurality of grooves in the mold layer, and
the method further includes:
removing the sacrificial layers through the grooves; and
forming a gate insulating layer and a word line in each of gap regions which are formed by removing the sacrificial layers.

11. A method of fabricating a semiconductor device, the method comprising:
forming a mold layer on a semiconductor substrate;
forming a deposition active layer on the mold layer;
forming a guide pattern on the deposition active layer to define an exposed surface of the deposition active layer;
forming a metal mask pattern on the exposed surface of the deposition active layer using an area-selective deposition method;
removing the guide pattern; and
sequentially etching the deposition active layer and the mold layer by using the metal mask pattern as an etch mask,
wherein the metal mask pattern is not formed on a top surface of the guide pattern, and
wherein forming the metal mask pattern includes repeating a process cycle a predetermined number of times, each process cycle including:
supplying a first source gas, the first source gas having a high adsorption rate on the deposition active layer and having a low adsorption rate on the guide pattern,
purging the first source gas that is not adsorbed on the deposition active layer;
supplying a second source gas that contains a metallic element constituting the metal mask pattern and that reacts with molecules of the first source gas adsorbed on the deposition active layer, to form a metal-containing single atomic layer of the metal mask pattern on the deposition active layer; and
purging the second source gas that does not react with the molecules of the first source gas.

12. The method as claimed in claim 11, wherein:
the metal mask pattern is in the form of a plurality of islands that are spaced apart from each other,
etching the mold layer includes forming a plurality of lower electrode holes in the mold layer, and
the method further includes:
forming a lower electrode in each of the lower electrode holes; and
removing the metal mask pattern, the deposition active layer, and the mold layer to expose a surface of the lower electrode.

13. The method as claimed in claim 11, wherein:
the metal mask pattern is in the form of a plurality, of islands that are spaced apart from each other,
the mold layer includes gate interlayered insulating layers and sacrificial layers that are alternately stacked one on another,
etching the mold layer includes forming a plurality of channel holes in the mold layer, and
the method further includes:
forming a channel pillar in each of the channel holes;
removing the sacrificial layers to partially expose sidewalls of the channel pillar; and
forming a gate insulating layer and a word line in each of regions that are formed by removing the sacrificial layers.

14. The method as claimed in claim 11, wherein:
the metal mask pattern is in the form of a plurality of line-shaped patterns that are spaced apart from each other,
the mold layer includes gate interlayered insulating layers and sacrificial layers that are alternately stacked one on another,
the etching of the mold layer includes forming a plurality of grooves in the mold layer, and
the method further includes:
removing the sacrificial layers through the grooves; and
forming a gate insulating layer and a word line in each of regions that are formed by removing the sacrificial layers.

15. A method of fabricating a semiconductor device, the method comprising:
forming an etching target layer on a semiconductor substrate;

forming a deposition active layer on the etching target layer;

forming a guide pattern on the deposition active layer such that the guide pattern exposes a surface of the deposition active layer;

selectively depositing a metal-containing layer on the surface of the deposition active layer exposed by the guide pattern to form a metal-containing etching mask; and etching the etching target layer using the metal-containing etching mask, wherein the metal-containing layer is not deposited on a top surface of the guide pattern, and wherein selectively depositing the metal-containing layer includes repeating a process cycle a predetermined number of times, each process cycle including:

supplying a first source gas, the first source gas having a high adsorption rate on the deposition active layer and having a low adsorption rate on the guide pattern, purging the first source gas that is not adsorbed on the deposition active layer;

supplying a second source gas that contains a metallic element constituting the metal-containing layer and that reacts with molecules of the first source gas adsorbed on the deposition active layer, to form a metal-containing single atomic layer of the metal-containing layer on the deposition active layer; and purging the second source gas that does not react with the molecules of the first source gas.

16. The method as claimed in claim 15, wherein the deposition active layer is a single crystalline silicon layer that is doped with impurities or is undoped or a poly-crystalline silicon layer that is doped with impurities or is undoped.

17. The method as claimed in claim 15, wherein the guide pattern is formed of silicon oxide, silicon nitride, or a hydrocarbon-based material.

18. The method as claimed in claim 15, wherein the metal-containing layer is formed of tungsten (W), tungsten nitride (WN), tungsten carbide (WC), titanium (Ti), tantalum (Ta), aluminum (Al), or hafnium (Hf).

\* \* \* \* \*